US009871854B2

(12) United States Patent
Nagargadde et al.

(10) Patent No.: US 9,871,854 B2
(45) Date of Patent: *Jan. 16, 2018

(54) INTERACTION WITH A VIRTUAL NETWORK

(71) Applicant: Amazon Technologies, Inc., Seattle, WA (US)

(72) Inventors: Aparna Nagargadde, Herndon, VA (US); Bashuman Deb, Herndon, VA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/685,104

(22) Filed: Apr. 13, 2015

(65) Prior Publication Data

US 2015/0288750 A1    Oct. 8, 2015

Related U.S. Application Data

(63) Continuation of application No. 12/985,979, filed on Jan. 6, 2011, now Pat. No. 9,009,217.

(51) Int. Cl.
*G06F 17/50* (2006.01)
*H04L 12/24* (2006.01)
*H04L 12/46* (2006.01)
*H04L 29/08* (2006.01)
*H04L 29/06* (2006.01)

(52) U.S. Cl.
CPC .......... *H04L 67/10* (2013.01); *G06F 17/5009* (2013.01); *H04L 12/4641* (2013.01); *H04L 41/0866* (2013.01); *H04L 67/42* (2013.01)

(58) Field of Classification Search
CPC .. H04L 41/08; H04L 41/0866; G06F 17/5009
See application file for complete search history.

(56) References Cited

U.S. PATENT DOCUMENTS

| 7,047,277 | B1 | 5/2006 | Welter et al. |
| 7,136,931 | B2 * | 11/2006 | Natarajan ............... H04L 41/12 370/254 |
| 8,166,474 | B1 | 4/2012 | Delco et al. |
| 2002/0129166 | A1 * | 9/2002 | Baxter ................ H04L 41/0226 709/246 |
| 2002/0161757 | A1 | 10/2002 | Mock et al. |

(Continued)

OTHER PUBLICATIONS

How to Use SNMP Agent Extention, Centreon, http.doc.cnetreon.com/HowToUseSNMPAgentExtension, last modified Feb. 24, 2010.

(Continued)

*Primary Examiner* — Khang Do
(74) *Attorney, Agent, or Firm* — Knobbe, Martens, Olson & Bear, LLP

(57) ABSTRACT

Systems and method for the management of virtual machine instances are provided. A network data transmission analysis system can host virtual machine networks. A component of a hosted virtual machine network is configured in a manner to receive commands directed towards a simulated network device. The component may then execute a process or processes on the hosted virtual machine network which correspond to the received command.

21 Claims, 13 Drawing Sheets

(56) References Cited

U.S. PATENT DOCUMENTS

| | | | |
|---|---|---|---|
| 2003/0125924 A1* | 7/2003 | Lines | H04L 29/06 703/20 |
| 2004/0165581 A1* | 8/2004 | Oogushi | H04L 12/2856 370/352 |
| 2004/0240455 A1* | 12/2004 | Shen | H04L 12/4679 370/400 |
| 2005/0050013 A1* | 3/2005 | Ferlitsch | G06F 3/1204 |
| 2005/0063395 A1* | 3/2005 | Smith | H04L 12/46 370/399 |
| 2007/0153808 A1* | 7/2007 | Parker | H04L 12/4641 370/395.53 |
| 2007/0192329 A1* | 8/2007 | Croft | G06F 3/1415 |
| 2008/0155537 A1 | 6/2008 | Dinda et al. | |
| 2008/0228914 A1 | 9/2008 | Ofel et al. | |
| 2009/0180138 A1 | 7/2009 | Fukuda | |
| 2009/0248896 A1* | 10/2009 | Cohn | H04L 29/12028 709/245 |
| 2010/0027420 A1 | 2/2010 | Smith | |
| 2010/0107162 A1 | 4/2010 | Edwards et al. | |
| 2011/0088086 A1 | 4/2011 | Swink et al. | |
| 2011/0246647 A1* | 10/2011 | Marquezan | H04L 43/00 709/224 |
| 2012/0209581 A1* | 8/2012 | Gao | H04L 41/0893 703/13 |

OTHER PUBLICATIONS

Understanding Simple Network Management Protocol (SNMP) Traps, Cisco, Document ID: 7244, http://www.cisco.com/application/pdf/paws/7244/, Oct. 10, 2006.

* cited by examiner

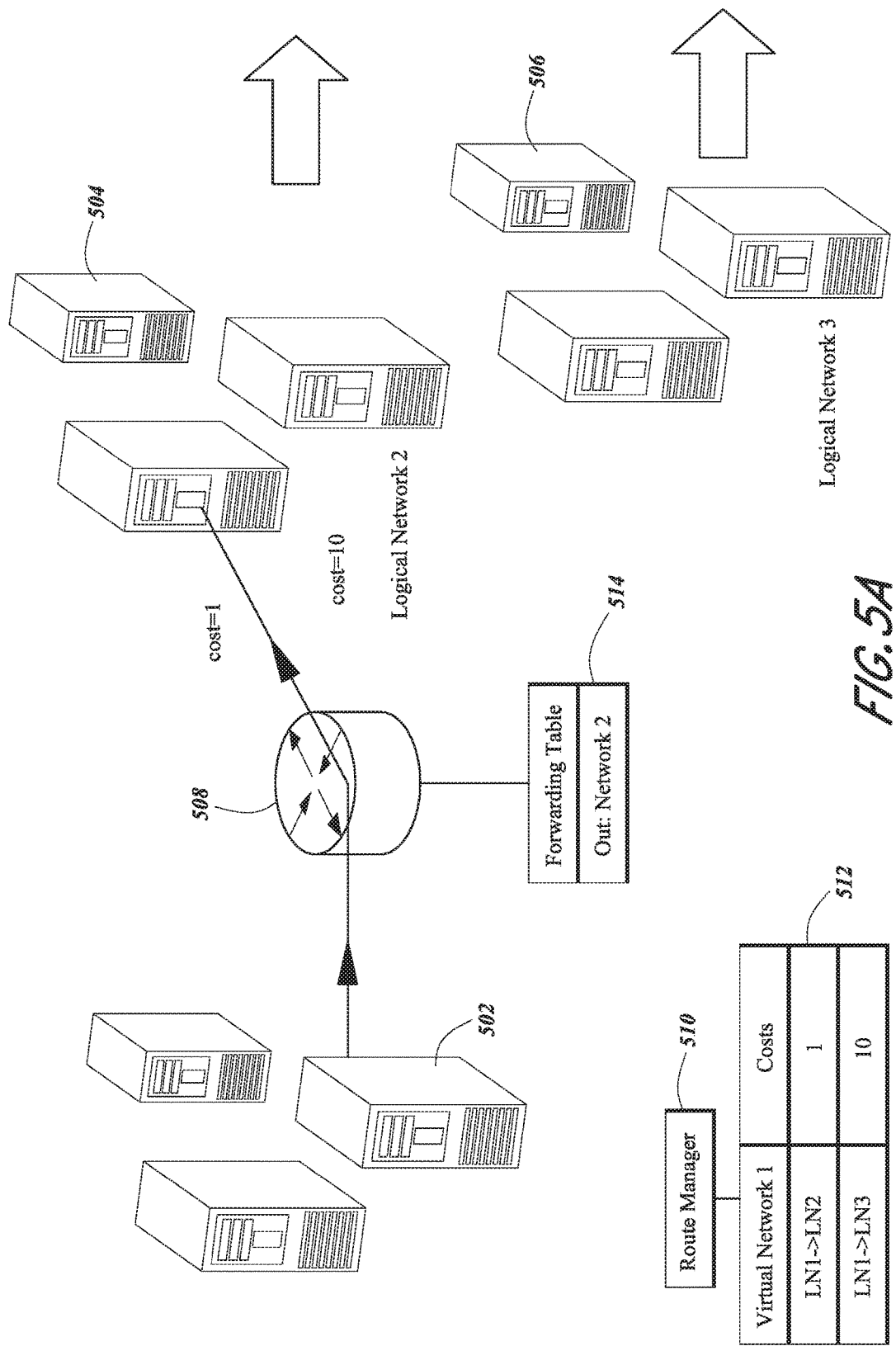

INTERACTION WITH A VIRTUAL NETWORK

CROSS-REFERENCE TO RELATED APPLICATION

This application is a continuation of U.S. patent application Ser. No. 12/985,979, entitled INTERACTION WITH A VIRTUAL NETWORK, and filed Jan. 6, 2011, the entirety of which is incorporated by reference herein.

BACKGROUND

Generally described, computing devices utilize a communication network, or a series of communication networks, to exchange data. Companies and organizations operate computer networks that interconnect a number of computing devices to support operations or provide services to third parties. The computing systems can be located in a single geographic location or located in multiple, distinct geographic locations (e.g., interconnected via private or public communication networks). Specifically, data centers or data processing centers, herein generally referred to as a "data center," may include a number of interconnected computing systems to provide computing resources to users of the data center. The data centers may be private data centers operated on behalf of an organization or public data centers operated on behalf, or for the benefit of, the general public.

To facilitate increased utilization of data center resources, virtualization technologies may allow a single physical computing device to host one or more instances of virtual machines that appear and operate as independent computing devices to users of a data center. With virtualization, the single physical computing device can create, maintain, delete, or otherwise manage virtual machines in a dynamic matter. In turn, users can request computer resources from a data center, including single computing devices or a configuration of networked computing devices, and be provided with varying numbers of virtual machine resources.

Generally, physical networks include a number of hardware devices that receive packets from a source network component and forward the packets to designated recipient network components. In physical networks, packet routing hardware devices are typically referred to as routers, which are implemented on stand-alone computing devices connected to a physical network. With the advent of virtualization technologies, networks and routing for those networks can now be simulated using commodity computing devices rather than actual routers.

Specifically, in one aspect, individuals, such as system administrators, wishing to manage a physical network may be familiar with specific methods of interfacing with network devices. For example, a routing device may provide a command line interface for administration of the router's functions. However, simulated routing devices implemented via virtual instances in a virtual network would not necessarily allow such interfaces.

BRIEF DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein:

FIGS. 5A and 5B are block diagrams of the substrate network of FIG. 1 illustrating virtual route selection propagation to the substrate network;

DETAILED DESCRIPTION

Figure 1:
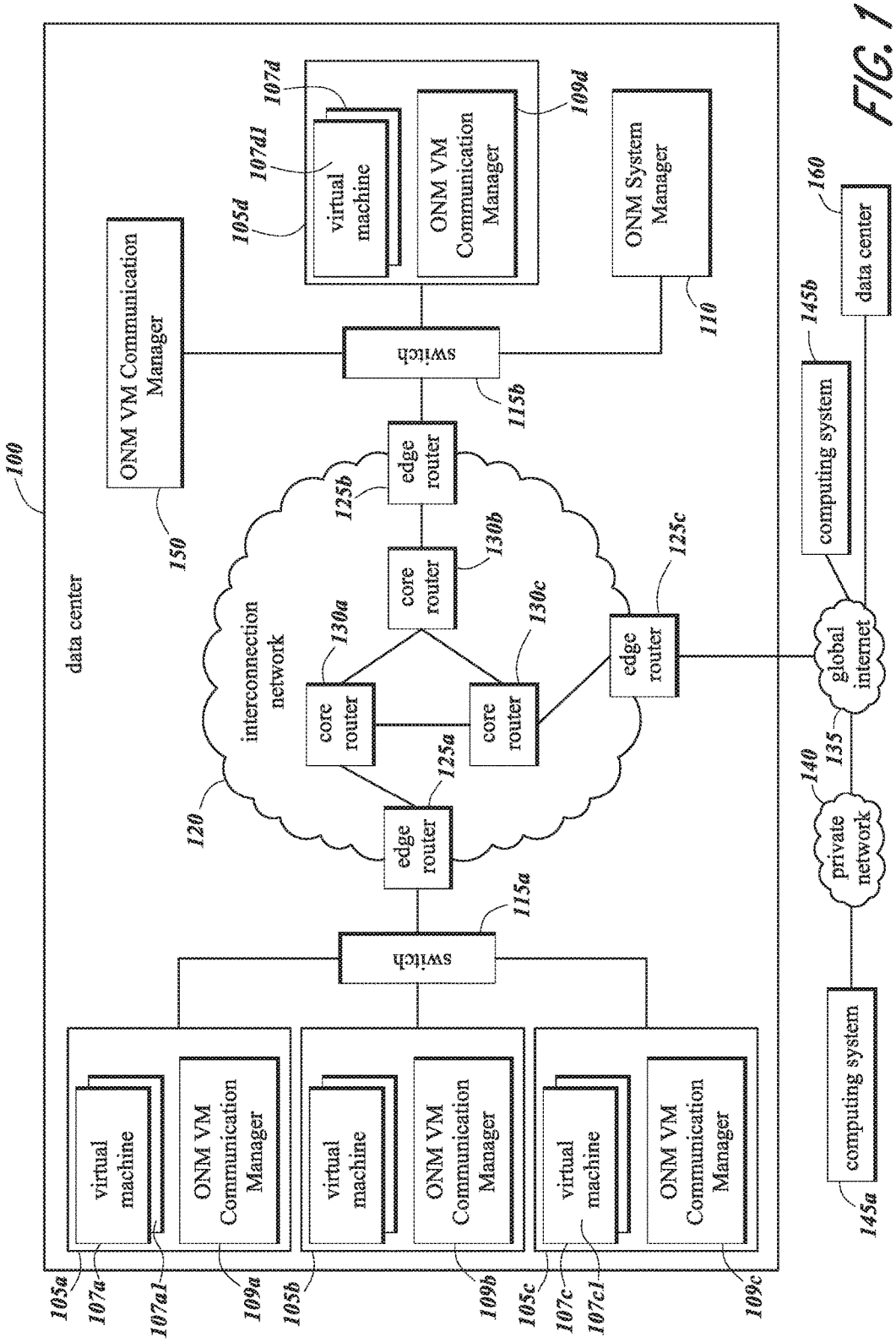
FIG. 1 is a block diagram illustrating an embodiment of a substrate network having computing nodes associated with a virtual computer network.

Generally described, aspects of the present disclosure relate to the management of virtual machine instances. Specifically, systems and methods are disclosed which facilitate user interaction with virtual networks in a manner similar to interaction with physical networks. In one aspect, a networking device interface is simulated by a component of virtual network. A user may access the simulated networking device interface and interact with the virtual network in such a manner that the virtualization of the network is transparent to the user. For example, a virtual network may be configured to simulate a physical network having physical devices connected via a physical router. Illustratively, the function of the simulated router may be implemented within the virtual network without the need to simulate the router or without any consideration of the actual routing within the virtual network. The user may attempt to send commands to the simulated router interface using an expected interface methods, for instance, a command line interface. In this aspect, an interface component of the virtual network may receive the command and determine the appropriate process or processes corresponding to the received command to be executed within the virtual network. The interface component may, where appropriate, send a response to the user indicating the results of the command. Illustratively, a user may transmit a command requesting that statistical information regarding the operation of the network, such as hop times or packet loss, be displayed. The component may, according to the command, determine an appropriate process or processes to be implemented by components of the virtual network in order to obtain the desired information. The interface component would then return the information to the user. In some embodiments, this information may be further formatted in accordance with the simulated router interface. As a further illustration, the interface component may serve to allow the user to alter simulated routing functionality. For example, a user may transmit a command to the simulated router interface specifying that traffic from various simulated network components be shaped in a specified manner. The interface component of the virtual network would then determine an appropriate process or processes to be implemented by components of the virtual network in order to simulate the user's desired functionality.

The following section discusses various embodiments of managed networks for network data transmission analysis. Following that is further discussion of network data transmission analysis systems and methods that can implement management methodologies established by a network user.

Managed Computer Networks for Network Data Transmission Analysis

With the advent of virtualization technologies, networks and routing for those networks can now be simulated using commodity hardware components. For example, virtualization technologies can be adapted to allow a single physical computing machine to be shared among multiple virtual networks by hosting one or more virtual machines on the single physical computing machine. Each such virtual machine can be a software simulation acting as a distinct logical computing system that provides users with the illusion that they are the sole operators and administrators of a given hardware computing resource. In addition, as routing can be accomplished through software, additional routing flexibility can be provided to the virtual network in comparison with traditional routing. As a result, in some implementations, supplemental information other than packet information can be used to determine network routing.

Aspects of the present disclosure will be described with regard to illustrative logical networking functionality for managed computer networks, such as for virtual computer networks that are provided on behalf of users or other entities. In at least some embodiments, the techniques enable a user to configure or specify a network topology, routing costs, routing paths, and/or other information for a virtual or overlay computer network including logical networking devices that are each associated with a specified group of multiple physical computing nodes. For example, a user (e.g., a network administrator for an organization) or service provider may configure a virtual or overlay network based on detected events, processing criteria, or upon request. With the network configuration specified for a virtual computer network, the functionally and operation of the virtual network can be simulated on physical computing nodes operating virtualization technologies. In some embodiments, multiple users or entities (e.g. businesses or other organizations) can access the system as tenants of the system, each having their own virtual network in the system. In one embodiment, a user's access and/or network traffic is transparent to other users. For example, even though physical components of a network may be shared, a user of a virtual network may not see another user's network traffic on another virtual network if monitoring traffic on the virtual network. Logical functionality of a managed computer network may be discussed with reference to substrate components. In an illustrative embodiment of the present disclosure, a substrate component can refer to one or more physical computing devices which allow the implementation of the discussed logical functionality. Where reference is made to a substrate network, such reference refers to one or more networked substrate components.

Figure 2:
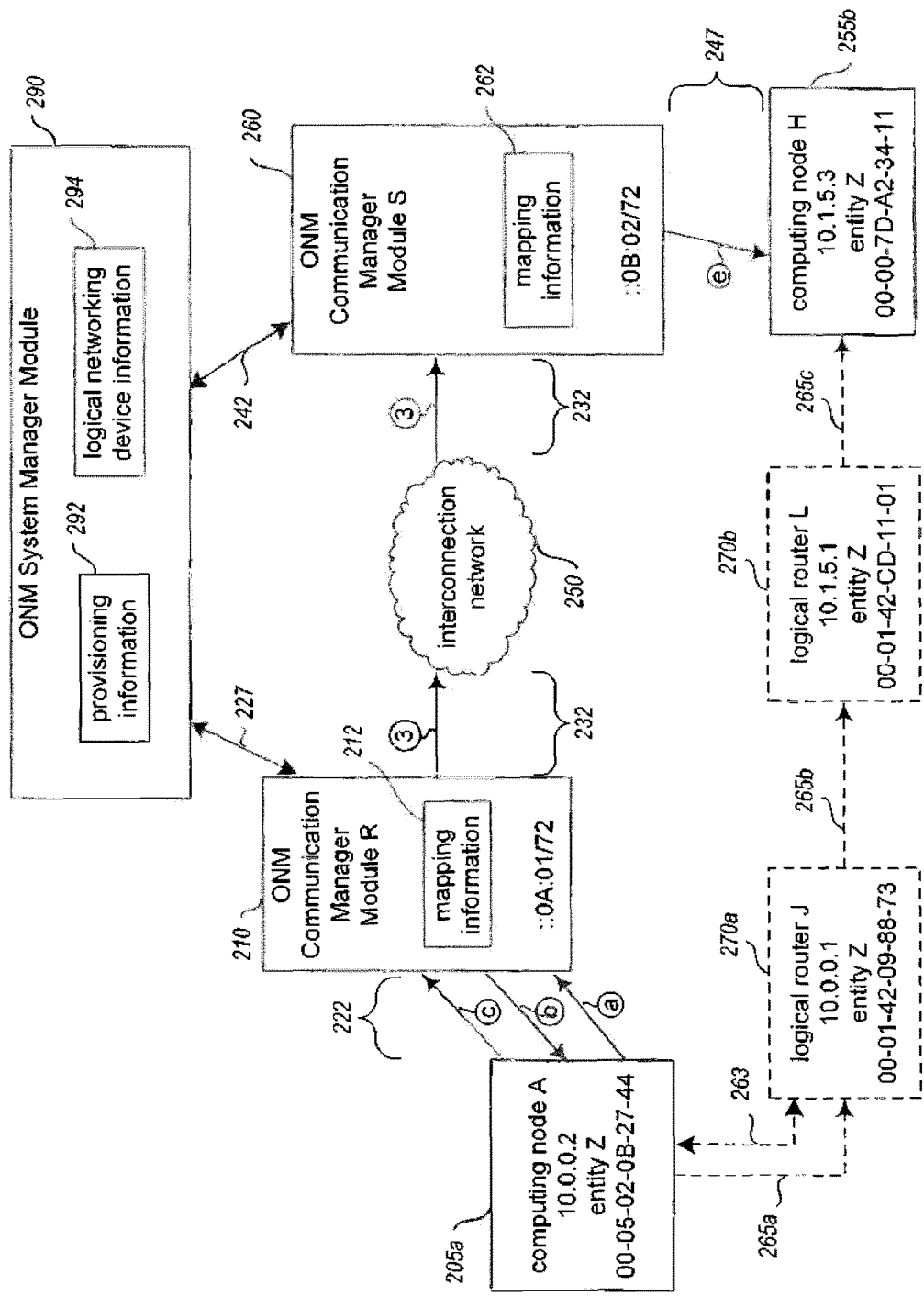
FIG. 2 is a block diagram of the substrate network of FIG. 1 illustrating logical networking functionality.

By way of overview, FIGS. 1 and 2 discuss embodiments where communications between multiple computing nodes of the virtual computer network emulate functionality that would be provided by logical networking devices if they were physically present. In some embodiments, some or all of the emulation are performed by an overlay network manager system. FIGS. 2-4B and 7B discuss embodiments where substrate routing decisions can be made independently of any simulated routing in the overlay network, allowing, for example, optimization of traffic on the substrate network based on information unavailable to a virtual network user. FIGS. 5A-7A discuss embodiments where routing decisions implemented on the virtual or overlay network are propagated to the substrate network. One skilled in the relevant art will appreciate, however, that the disclosed virtual computer network is illustrative in nature and should not be construed as limiting.

Overlay Network Manager

FIG. 1 is a network diagram illustrating an embodiment of an overlay network manager system (ONM) for managing computing nodes associated with a virtual computer network. Virtual network communications can be overlaid on one or more intermediate physical networks in a manner transparent to the computing nodes. In this example, the ONM system includes a system manager module 110 and multiple communication manager modules 109a, 109b, 109c, 109d, 150 to facilitate the configuring and managing communications on the virtual computer network.

The illustrated example includes an example data center 100 with multiple physical computing systems operated on behalf of the ONM system. The example data center 100 is connected to a global internet 135 external to the data center 100. The global internet can provide access to one or more computing systems 145a via private network 140, to one or more other globally accessible data centers 160 that each have multiple computing systems, and to one or more other computing systems 145b. The global internet 135 can be a publicly accessible network of networks, such as the Internet, and the private network 140 can be an organization's network that is wholly or partially inaccessible from computing systems external to the private network 140. Computing systems 145b can be home computing systems or mobile computing devices that each connects directly to the global internet 135 (e.g., via a telephone line, cable modem, a Digital Subscriber Line ("DSL"), cellular network or other wireless connection, etc.).

The example data center 100 includes a number of physical computing systems 105a-105d and a Communication Manager module 150 that executes on one or more other computing systems. The example data center further includes a System Manager module 110 that executes on one or more computing systems. In this example, each physical computing system 105a-105d hosts multiple virtual machine computing nodes and includes an associated virtual machine ("VM") communication manager module (e.g., as part of a virtual machine hypervisor monitor for the physical computing system). Such VM communications manager modules and VM computing nodes include VM Communication Manager module 109a and virtual machines 107a on host computing system 105a, and VM Communication Manager module 109d and virtual machines 107d on host computing system 105d.

This illustrative data center 100 further includes multiple physical networking devices, such as switches 115a-115b, edge router devices 125a-125c, and core router devices 130a-130c. Switch 115a is part of a physical sub-network that includes physical computing systems 105a-105c, and is connected to edge router 125a. Switch 115b is part of a distinct physical sub-network that includes the System Manager module 110, and is connected to edge router 125b. The physical sub-networks established by switches 115a-115b, in turn, are connected to each other and other networks (e.g., the global internet 135) via an intermediate communication network 120, which includes the edge routers 125a-125c and the core routers 130a-130c. The edge routers 125a-125c provide gateways between two or more sub-networks or networks. For example, edge router 125a provides a gateway between the physical sub-network established by switch 115a and the interconnection network 120, while edge router 125c provides a gateway between the interconnection network 120 and global internet 135. The core routers 130a-130c manage communications within the interconnection network 120, such as by routing or otherwise forwarding packets or other data transmissions as appropriate based on characteristics of such data transmissions (e.g., header information including source and/or destination addresses, protocol identifiers, etc.) and/or the characteristics of the interconnection network 120 itself (e.g., routes based on the physical network topology, etc.).

The System Manager module 110 and Communication Manager module 109 can configure, authorize, and otherwise manage communications between associated computing nodes, including providing logical networking functionality for one or more virtual computer networks that are provided using the computing nodes. For example, Communication Manager module 109a and 109c manages associated virtual machine computing nodes 107a and 107c and each of the other Communication Manager modules can similarly manage communications for a group of one or more other associated computing nodes. The Communication Manager modules can configure communications between computing nodes so as to overlay a virtual network over one or more intermediate physical networks that are used as a substrate network, such as over the interconnection network 120.

Furthermore, a particular virtual network can optionally be extended beyond the data center 100, such as to one or more other data centers 160 which can be at geographical locations distinct from the first data center 100. Such data centers or other geographical locations of computing nodes can be inter-connected in various manners, including via one or more public networks, via a private connection such as a direct or VPN connection, or the like. In addition, such data centers can each include one or more other Communication Manager modules that manage communications for computing systems at that data. In some embodiments, a central Communication Manager module can coordinate and manage communications among multiple data centers.

Thus, as one illustrative example, one of the virtual machine computing nodes 107a1 on computing system 105a can be part of the same virtual local computer network as one of the virtual machine computing nodes 107d1 on computing system 105d. The virtual machine 107a1 can then direct an outgoing communication to the destination virtual machine computing node 107d1, such as by specifying a virtual network address for that destination virtual machine computing node. The Communication Manager module 109a receives the outgoing communication, and in at least some embodiments determines whether to authorize the sending of the outgoing communication. By filtering unauthorized communications to computing nodes, network isolation and security of entities' virtual computer networks can be enhanced.

The Communication Manager module 109a can determine the actual physical network location corresponding to the destination virtual network address for the communication. For example, the Communication Manager module 109a can determine the actual destination network address by dynamically interacting with the System Manager module 110, or can have previously determined and stored that information. The Communication Manager module 109a then re-headers or otherwise modifies the outgoing communication so that it is directed to Communication Manager module 109d using an actual substrate network address.

When Communication Manager module 109d receives the communication via the interconnection network 120, it obtains the virtual destination network address for the communication (e.g., by extracting the virtual destination network address from the communication), and determines to which virtual machine computing nodes 107d the communication is directed. The Communication Manager module 109d then re-headers or otherwise modifies the incoming communication so that it is directed to the destination virtual machine computing node 107d1 using an appropriate virtual network address for the virtual computer network, such as by using the sending virtual machine computing node 107a1's virtual network address as the source network address and by using the destination virtual machine computing node 107d1's virtual network address as the destination network address. The Communication Manager module 109d then forwards the modified communication to the destination virtual machine computing node 107d1. In at least some embodiments, before forwarding the incoming communication to the destination virtual machine, the Communication Manager module 109d can also perform additional steps related to security.

Further, the Communication Manager modules 109a and/or 109c on the host computing systems 105a and 105c can perform additional actions that correspond to one or more logical specified router devices lying between computing nodes 107a1 and 107c1 in the virtual network topology. For example, the source computing node 107a1 can direct a packet to a logical router local to computing node 107a1 (e.g., by including a virtual hardware address for the logical router in the packet header), with that first logical router being expected to forward the packet to the destination node 107c1 via the specified logical network topology. The source Communication Manager module 109a receives or intercepts the packet for the logical first router device and can emulate functionality of some or all of the logical router devices in the network topology, such as by modifying a TTL ("time to live") hop value for the communication, modifying a virtual destination hardware address, and/or otherwise modify the communication header. Alternatively, some or all the emulation functionality can be performed by the destination Communication Manager module 109c after it receives the packet.

By providing logical networking functionality, the ONM system provides various benefits. For example, because the various Communication Manager modules manage the overlay virtual network and can emulate the functionality of logical networking devices, in certain embodiments specified networking devices do not need to be physically implemented to provide virtual computer networks, allowing greater flexibility in the design of virtual user networks. Additionally, corresponding modifications to the interconnection network 120 or switches 115a-115b are generally not needed to support particular configured network topologies. Nonetheless, a particular network topology for the virtual computer network can be transparently provided to the computing nodes and software programs of a virtual computer network.

Logical/Virtual Networking

FIG. 2 illustrates a more detailed implementation of the ONM system of FIG. 1 supporting logical networking functionality. The ONM system includes more detailed embodiments of the ONM System Manager and ONM Communication Manager of FIG. 1. In FIG. 2, computing node A is sending a communication to computing node H, and the actions of the physically implemented modules 210 and 260 and devices of network 250 in actually sending the communication are shown, as well as emulated actions of the logical router devices 270a and 270b in logically sending the communication.

In this example, computing nodes A 205a and H 255b are part of a single virtual computer network for entity Z. However, computing nodes can be configured to be part of two distinct sub-networks of the virtual computer network and the logical router devices 270a and 270b separate the computing nodes A and H in the virtual network topology. For example, logical router device J 270a can be a local router device to computing node A and logical router device L 270b can be a local router device to computing node H.

In FIG. 2, computing nodes A 205a and H 255b includes hardware addresses associated with those computing nodes for the virtual computer network, such as virtual hardware addresses that are assigned to the computing nodes by the System Manager module 290 and/or the Communication Manager modules R 210 and S 260. In this example, computing node A has been assigned hardware address "00-05-02-0B-27-44," and computing node H has been assigned hardware address "00-00-7D-A2-34-11." In addition, the logical router devices J and L have also each been assigned hardware addresses, which in this example are "00-01-42-09-88-73" and "00-01-42-CD-11-01," respectively, as well as virtual network addresses, which in this example are "10.0.0.1" and "10.1.5.1," respectively. The System Manager module 290 maintains provisioning information 292 that identifies where each computing node is actually located and to which entity and/or virtual computer network the computing node belongs.

In this example, computing node A 205a first sends an address resolution protocol (ARP) message request 222-a for virtual hardware address information, where the message is expected to first pass through a logical device J before being forwarded to computing node H. Accordingly, the ARP message request 222-a includes the virtual network address for logical router J (e.g., "10.0.0.1") and requests the corresponding hardware address for logical router J.

Communication Manager module R intercepts the ARP request 222-a, and obtains a hardware address to provide to computing node A as part of spoofed ARP response message 222-b. The Communication Manager module R can determine the hardware address by, for example, looking up various hardware address information in stored mapping information 212, which can cache information about previously received communications. Communication Manager module R can communicate 227 with the System Manager module 290 to translate the virtual network address for logical router J.

The System Manager module 290 can maintain information 294 related to the topology and/or components of virtual computer networks and provide that information to Communication Manager modules. The Communication Manager module R can then store the received information as part of mapping information 212 for future use. Communication Manager module R then provides computing node A with the hardware address corresponding to logical router J as part of response message 222-b. While request 222-a and response message 222-b actually physically pass between computing node A and Communication Manager module R, from the standpoint of computing node A, its interactions occur with local router device J.

After receiving the response message 222-b, computing node A 205a creates and initiates the sending of a communication 222-c to computing node H 255b. From the standpoint of computing node A, the sent communication will be handled as if logical router J 270a were physically implemented. For example, logical router J could modify the header of the communication 265a and forward the modified communication 265b to logical router L 270a, which would similarly modify the header of the communication 265b and forward the modified communication 265c to computing node H. However, communication 222-c is actually intercepted and handled by Communication Manager module R, which modifies the communication as appropriate, and forwards the modified communication over the interconnection network 250 to computing node H by communication 232-3. Communication Manager module R and/or Communication Manager module S may take further actions in this example to modify the communication from computing node A to computing node H or vice versa to provide logical networking functionality. For example, Communication Manager module S can provides computing node H with the hardware address corresponding to logical router L as part of response message 247-e by looking up the hardware address in stored mapping information 262. In one embodiment, a communication manager or computing node encapsulates a packet with another header or label where the additional header specifies the route of the packet. Recipients of the packet can then read the additional header and direct the packet accordingly. A communication manager at the end of the route can remove the additional header.

A user or operator can specify various configuration information for a virtual computer network, such as various network topology information and routing costs associated with the virtual 270a, 270b and/or substrate network 250. In turn, the ONM System Manager 290 can select various computing nodes for the virtual computer network. In some embodiments, the selection of a computing node can be based at least in part on a geographical and/or network location of the computing node, such as an absolute location or a relative location to a resource (e.g., other computing nodes of the same virtual network, storage resources to be used by the computing node, etc.). In addition, factors used when selecting a computing node can include: constraints related to capabilities of a computing node, such as resource-related criteria (e.g., an amount of memory, an amount of processor usage, an amount of network bandwidth, and/or an amount of disk space), and/or specialized capabilities available only on a subset of available computing nodes; constraints related to costs, such as based on fees or operating costs associated with use of particular computing nodes; or the like.

Route Selection on Substrate Network

Figure 3:
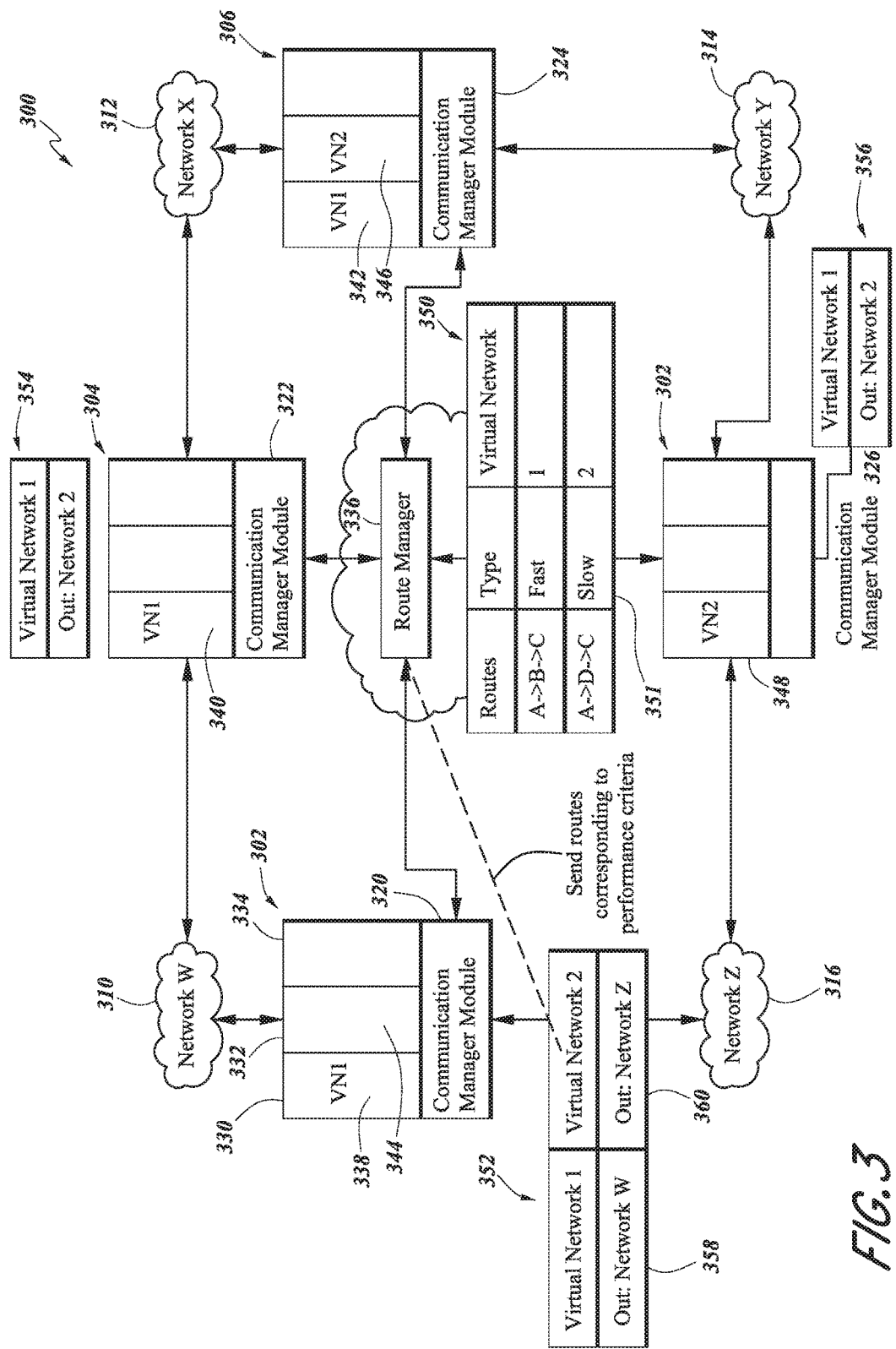
FIG. 3 is a block diagram of the substrate network of FIG. 1 illustrating a substrate network configuration associated with overlay networks.

FIG. 3 illustrates an example embodiment of a substrate network 300 having a route manager 336 capable of determining routes for overlay networks. The substrate network 300 can be composed of one or more substrate components or nodes, such as computing nodes, routing nodes, communication links or the like. In FIG. 3, the substrate network 300 includes computing nodes A 302, B 304, C 306, and D 308, which are capable of simulating various components of one or more associated overlay networks. The nodes can be located on the same data center or in multiple data centers. Computing node A is interconnected to node B via network W 310, node B is connected to node C by network X 312, node C is connected to node D by network Y 314, and node D is connected to node A by network Z 316. Networks W, X, Y, and Z can include one or more physical networking devices, such as routers, switches, or the like, and can include private or public connections. Components shown in FIG. 3, such as the computing nodes and communication manager modules, can implement certain of the features of embodiments described above with respect to FIGS. 1 and 2.

In FIG. 3, nodes A 302, B 304, C 306, and D 308 are associated with a respective Communication Manager module 320, 322, 324, and 326. The communication manager modules can implement certain of the features described in the Communication Manager 150, 210, 260 and VM Communication manager 109a, 109b, 109c, 109d of FIGS. 1 and 2. For example, the Communication Manager module 320 for node A can operate on a hypervisor monitor of the computing node and can direct the communication of one or more virtual computing nodes 330, 332, 334 of node A. The computing nodes, communication managers and Route Manager 336 can be part of the same ONM system. In one embodiment, the computing nodes run the XEN operating system (OS) or similar virtualization OS, with the communication managers operating on domain 0 or the first OS instance and the virtual computing nodes being domain U or additional OS instances.

The communication manager modules in FIG. 3 are in communication with a Route Manager module 336, operating on one or more computing devices, that directs routing for the substrate network 300. In one embodiment, the Route Manager operates as part of the ONM System Manager module 110, 290 of FIGS. 1 and 2, with functionally combined into a single module. The Route Manager can be located within a data center or at a regional level and direct traffic between data centers. In one embodiment, multiple Route Managers can operate in a distributed manner to coordinate routing across multiple data centers.

In FIG. 3, two virtual networks are associated with the substrate network 300. Virtual network 1 (VN1) has components 338, 340, 342, associated with virtual computing nodes on computing nodes A 302, B 304, and C 306. Virtual network 2 (VN2) has components 344, 346, 348 associated with virtual computing nodes on nodes A, C, and D 308.

As the Routing Manager module 336 directs network traffic on the substrate network 300, traffic can be directed flexibly and various network configurations and network costs can be considered. For example, routing paths can be determined based on specified performance levels for the virtual networks. In one embodiment, if the user for VN1 is entitled to a higher service level, such as for faster speed (e.g. lower latency and/or higher bandwidth), traffic associated with VN1 can be routed on a "fast" path of the substrate network 300. For example, in one embodiment, traffic for "platinum" users is prioritized over traffic for "gold" and "silver" users, with traffic from "gold" users prioritized over "silver" users. In one embodiment, at least some packets of the user with the higher service level are prioritized over packets of a user with a lower service level, for example, during times of network congestion. The user may be entitled to a higher level because the user has purchased the higher service level or earned the higher service level through good behavior, such as by paying bills, complying with the operator's policies and rules, not overusing the network, combinations of the same, or the like.

The Route Manager 336 can store user information or communicate with a data store containing user information in order to determine the target performance level for a virtual network. The data store can be implemented using databases, flat files, or any other type of computer storage architecture and can include user network configuration, payment data, user history, service levels, and/or the like. Typically, the Route Manager will have access to node and/or link characteristics for the substrate nodes and substrate links collected using various network monitoring technologies or routing protocols. The Route Manager can then select routes that correspond to a selected performance level for the virtual network and send these routes to the computing nodes. For example, network W 310 and Y 312 can be built on fiber optic lines while network Y 314 and Z 316 are built on regular copper wire. The Route Manager can receive network metrics data and determine that the optical lines are faster than the copper wires (or an administrator can designate the optical lines as a faster path). Thus, the Route Manager, in generating a route between node A 302 and node C 306 for "fast" VN1 traffic, would select a path going through network W and Y (e.g., path A-B-C).

In another situation, where the user for VN2 is not entitled to a higher service level, VN2 traffic from node A 302 to node B 306 can be assigned to a "slow" or default path through network Y 314 and Z 316 (e.g. path A-D-C). In order to track routing assignments, the Routing Manager can maintain the routes and/or route association in a data store, such as a Routing Information Base (RIB) or routing table 350. The Route Manager can also track the target performance criteria 351 associated with a particular virtual network.

In order to direct network traffic on the substrate network 300, the Routing Manager 336 can create forwarding entries for one or more of the Communication Manager modules 320, 322, 324, 326 that direct how network traffic is routed by the Communication Manager. The Communication Manager modules can store those entries in forwarding tables 352, 354, 356, or other similar data structure, associated with a Communication Manager. For example, for VN1, the Route Manager can generate a control signal or message, such as a forwarding entry 358, that directs VN1 traffic received or generated on node A 302 through network W 310 (on path A-B-C). Meanwhile, for VN2, the Route Manager can generate a control signal or message, such as a forwarding entry 360, which directs traffic received on node A through network Z. The Route Manager can send these forwarding entries to the node A Communication Manager 320, which can store them on its forwarding table 352. Thus, network traffic associated with VN1 and VN2, destined for node C 306 received or generated on node A can travel by either path A-B-C or path A-D-C based on the designated performance level for VN1 and VN2.

While the example of FIG. 3 depicts only two virtual networks, the Route Manager 336 can similarly generate and maintain routes for any number of virtual networks. Likewise, the substrate network 300 can include any number of computing nodes and/or physical network devices. Routes can be determined based on multiple performance criteria, such as network bandwidth, network security, network latency, and network reliability. For example, traffic for a virtual network suspected of being used for spamming (e.g. mass advertisement emailing) can be routed through network filters and scanners in order to reduce spam.

Figure 4A:
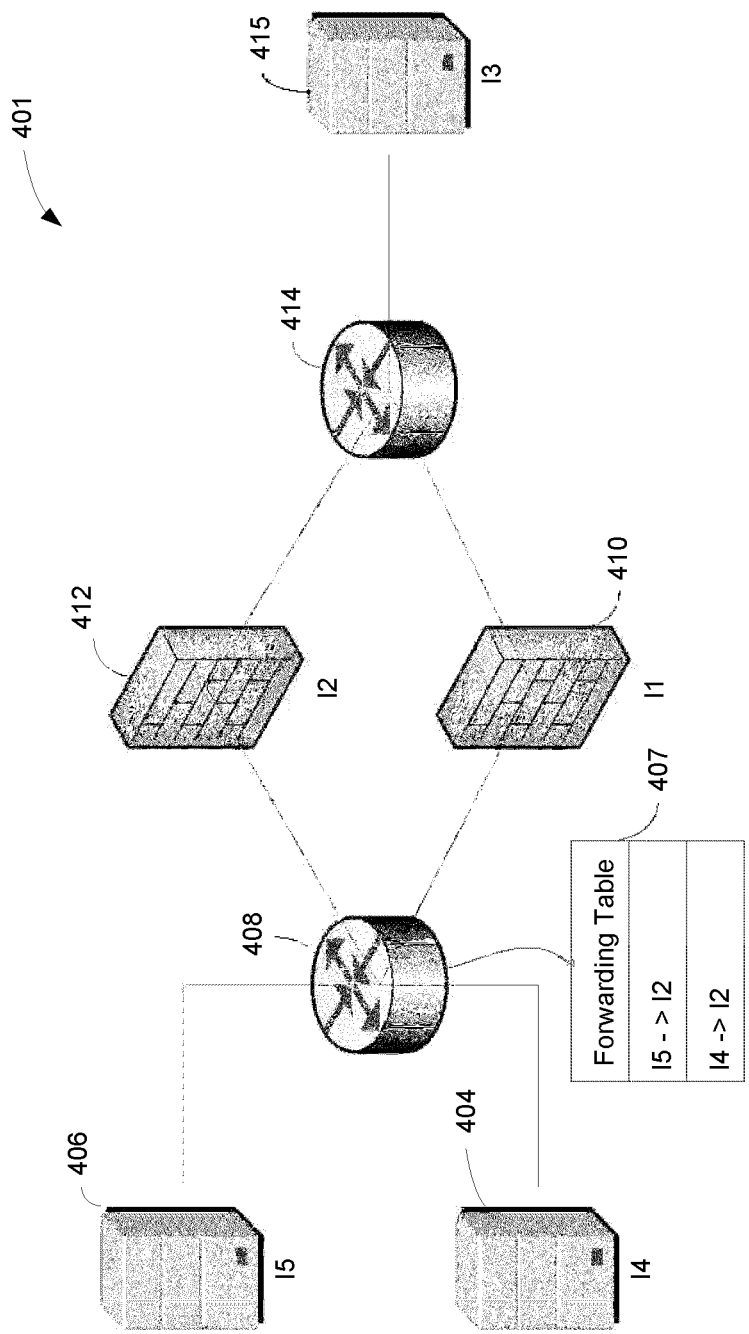
FIGS. 4A and 4B are block diagrams of the substrate network of FIG. 1 illustrating independently determined substrate routing.
Figure 4B:
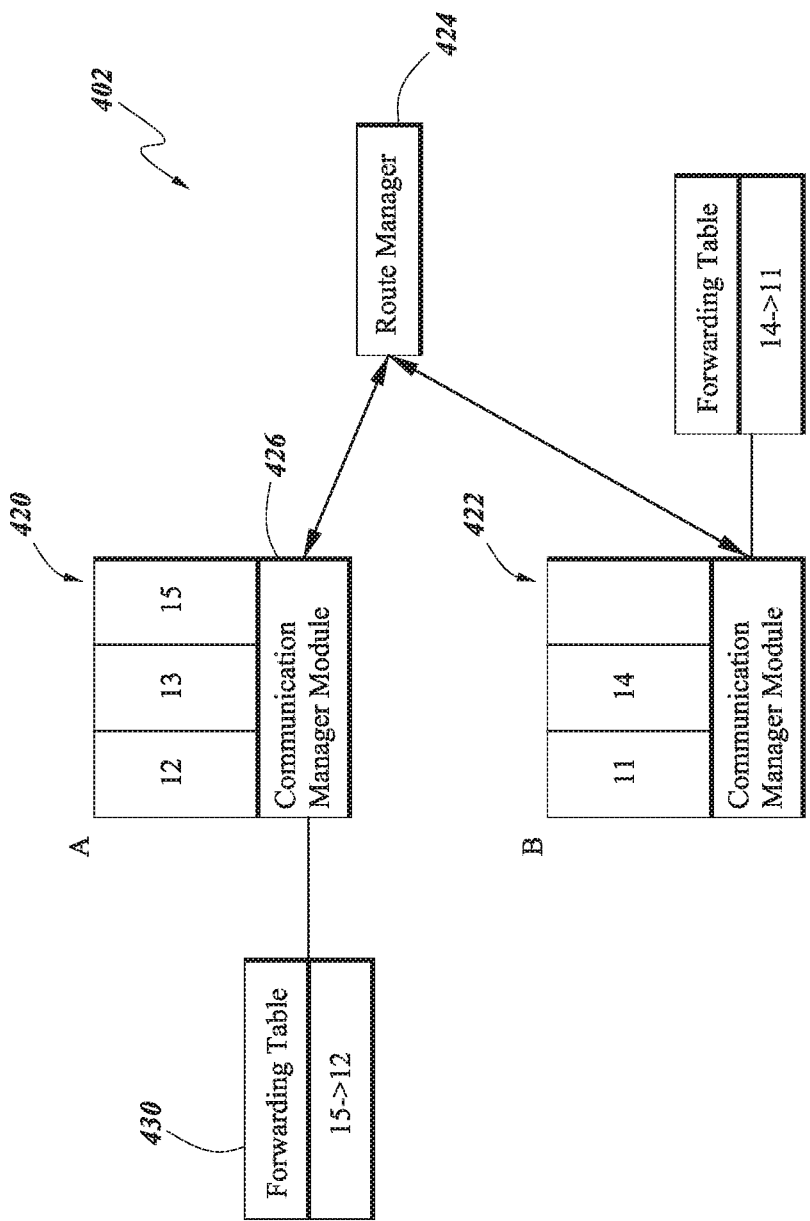

FIGS. 4A and 4B illustrate a virtual network 401 and corresponding substrate network 402 where substrate routing is independently determined from virtual routing. FIG. 4A illustrates a virtual network including several virtual network components. Virtual computing nodes I4 404 and I5

406 are connected to a logical router 408. The logical router can implement certain of the features described in the logical router 270a, 270b of FIG. 2. The logical router is connected to firewalls I1 410 and I2 412. The logical router is configured to direct traffic from I5 to I2 and I4 to I2, as would be the case if I2 were a backup firewall. The forwarding table associated with logical router 409 reflects this traffic configuration. I1 and I2 are connected to a second router 414. The second router is connected to another virtual computing node, I3 415. Thus, based on the topology and associated forwarding table of the virtual network 401, traffic from I4 and I5 to I3 passed through I2.

FIG. 4B illustrates an example topology of the substrate network 402 associated with the virtual network 401. The substrate network includes computing node A 420, computing node B, and a Route Manager 424. Substrate nodes A and B are each associated with a Communication Manager 426, 428. Node A is simulating the operation of virtual components I2, I3, and I5 while Node B is simulating the operation of virtual components on I1 and I4 on their respective virtual machines. The Route Manager can then use information regarding the assignments of virtual components to computing nodes to optimize or otherwise adjust routing tables for the substrate network. The Route Manager can receive such information from the Communication Managers and/or the System Manager. For example, assuming I1 and I2 are identical virtual firewalls, the Route Manager can determine that because I5 and I2 are located on the same computing node, while I4 and I1 are located on the other node, virtual network traffic can be routed from I5 to I2 and from I4 to I1 without leaving the respective computing node, thus reducing traffic on the network. Such a configuration is reflected in the illustrated forwarding tables 430, 432 associated with the Communication Managers. Thus, routes on the substrate network can be determined independently of virtual network routes.

In some embodiments, the Route Manager 424 or System Manager can optimize or otherwise improve network traffic using other techniques. For example, with reference to FIGS. 4A and 4B, another instance of I3 can be operated on node B 422, in addition to the instance of I3 on node A. Thus, virtual network traffic from I5-I2-I3 and I4-I1-I3 can remain on the same computing node without having to send traffic between computing nodes A and B. In one embodiment, substrate traffic can be optimized or otherwise improved without having different forwarding entries on the substrate and the virtual network. For example, with reference to FIG. 4B, I4 can be moved from computing node B 422 to node A 420, thus allowing virtual traffic from I5 and I4 to I2 to remain on the same computing node. In this way, a user monitoring traffic on logical router 408 would see that traffic is flowing according the forwarding table in the router, that is, substrate routing is transparent to the user. Other techniques for optimizing traffic by changing the association of virtual components with virtual machines and/or duplicating components can also be used.

In some situations, it can be desired that substrate routes reflect routes specified in the virtual table. For example, the virtual network user can wish to control how traffic is routed in the substrate network. However, rather than giving the user access to the substrate network, which could put other users at risk or otherwise compromise security, a data center operator can propagate network configuration or virtual network characteristics specified by the user for the virtual network to the substrate network. This propagated data can be used in generating routing paths in the substrate network, thus allowing the user to affect substrate routing without exposing the substrate layer to the user.

Route Selection on Overlay/Virtual Network

Figure 5B:
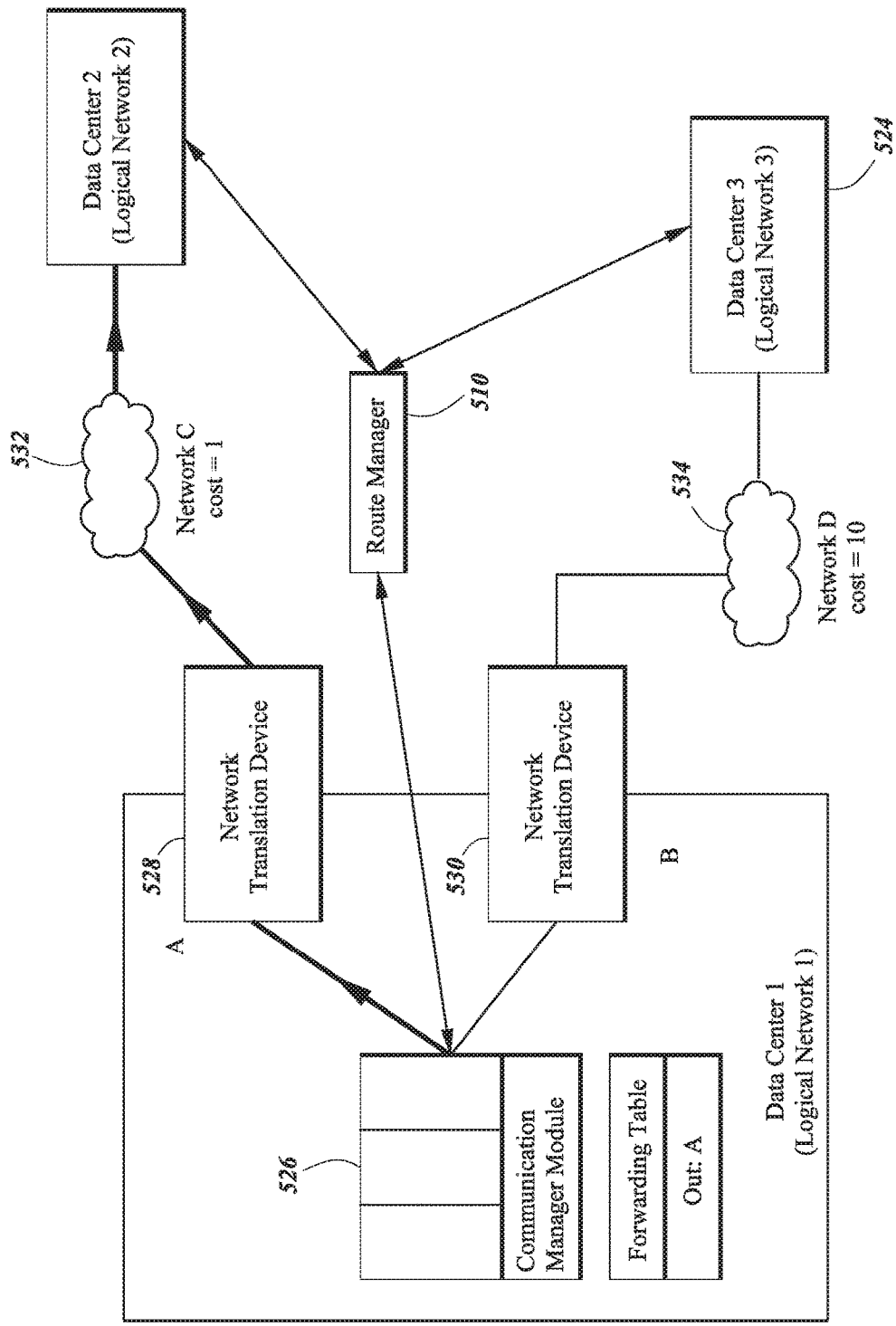

FIGS. 5A and 5B illustrate a virtual route selection propagated to the substrate network. FIG. 5A illustrates a virtual network topology where logical network 1 (LN1) 502 is connected to logical network 2 (LN2) 504 and logical network 3 (LN3) 506 by a logical router 508. The current preferred routing path specified by the user is from LN1 to LN2.

A user may wish to specify a route for various reasons. For example, routing costs through LN2 can be cheaper than LN3, such as when LN2 and LN3 are in different locations with different ISPs and one ISP charges lower rates than another. In another example, LN3 can be a backup virtual network for LN2, and used only in some situations, such as for handling overflow from LN2.

Referring back to FIG. 5A, the user can specify preferred routes through the virtual network and/or characteristics or costs associated with the virtual components, such as monetary costs, packet loss rates, reliability rate, and/or other metrics. These characteristics can be assigned to the virtual components, such as the virtual computing nodes, node links, logical routers/switches, or the like. The Route Manager 510 can then determine routing tables 512 and/or forwarding tables 514 for the virtual network.

FIG. 5B illustrates an example of a substrate route that can correspond to the virtual route in FIG. 5A. In the figure, there are three data centers 520, 522, 524 corresponding to the logical networks 502, 504, 506 of FIG. 5A. In data center 1 (DC1), a computing node 526 is connected to a network translation device A (NTD A) 528 and a network translation device B (NTD B) 530. The network translation devices are connected to external networks C 532 and D 534, respectively.

The network translation devices can serve as a gateway or entry/exit point into the virtual network. In some embodiments, the network translation devices can translate between a first addressing protocol and a second addressing protocol. For example, if the virtual network is using IPv6 and the external networks are using IPv4, the network translation devices can translate from one addressing protocol to the other for traffic in either direction. In one embodiment, users connect from their private networks to the data centers via a VPN or other connection to a network translation device, which translates and/or filters the traffic between networks.

Referring back to FIG. 5B, network C 532 connects data center 2 522 to NTD A 528. Network D 534 connects data center 3 524 to NTD B 530. The Route Manager module 510 is in communication with data center 1 520, data center 2 522, and data center 3 524, particularly with the Communication Manager for the computing node 526.

From information associated with the virtual network, the Route Manager 510 can determine that the user wants to route traffic from LN1 to LN2. The Route Manager can then "favor" substrate routes associated with the LN1 to LN2 virtual path. For example, the Route Manager can specify a low routing cost (e.g. cost 1) for communications, such as data packets, travelling on Network C relative to Network D (e.g. cost 10) such that during route determination, routes through Network C are favored. In one embodiment, the Route Manager can apply a coefficient to stored substrate costs in order to favor one route over another. In another example, explicit routing paths can be set up corresponding to the virtual route. The Route Manager can identify routes in its routing table and communicate those routes with one or more Communication Managers.

Referring back to FIG. 5B, when the computing node 526 receives or generates a packet destined for LN2 or a network reachable from LN2, the computing node can be configured by the Route Manager to send packets through NTD A 528 as it lies on the route including network C 532.

By propagating virtual network configuration data to the substrate, and using that configuration data in substrate route calculation, a mechanism is provided for a virtual network user to affect substrate routing. In some embodiments, the virtual configuration data can be used in determining association of the virtual components with the substrate components. For example, components of the same virtual network can be associated with the same substrate computing node or on computing nodes connected to the same switch in order to minimize or otherwise improve substrate network traffic. Configuration data can also be provided the other way and, in some embodiments, the user and/or virtual network can be provided with additional substrate information, such as characteristics of the underlying associated substrate components (e.g. performance, costs) in order to make more informed routing decisions.

Figure 6:
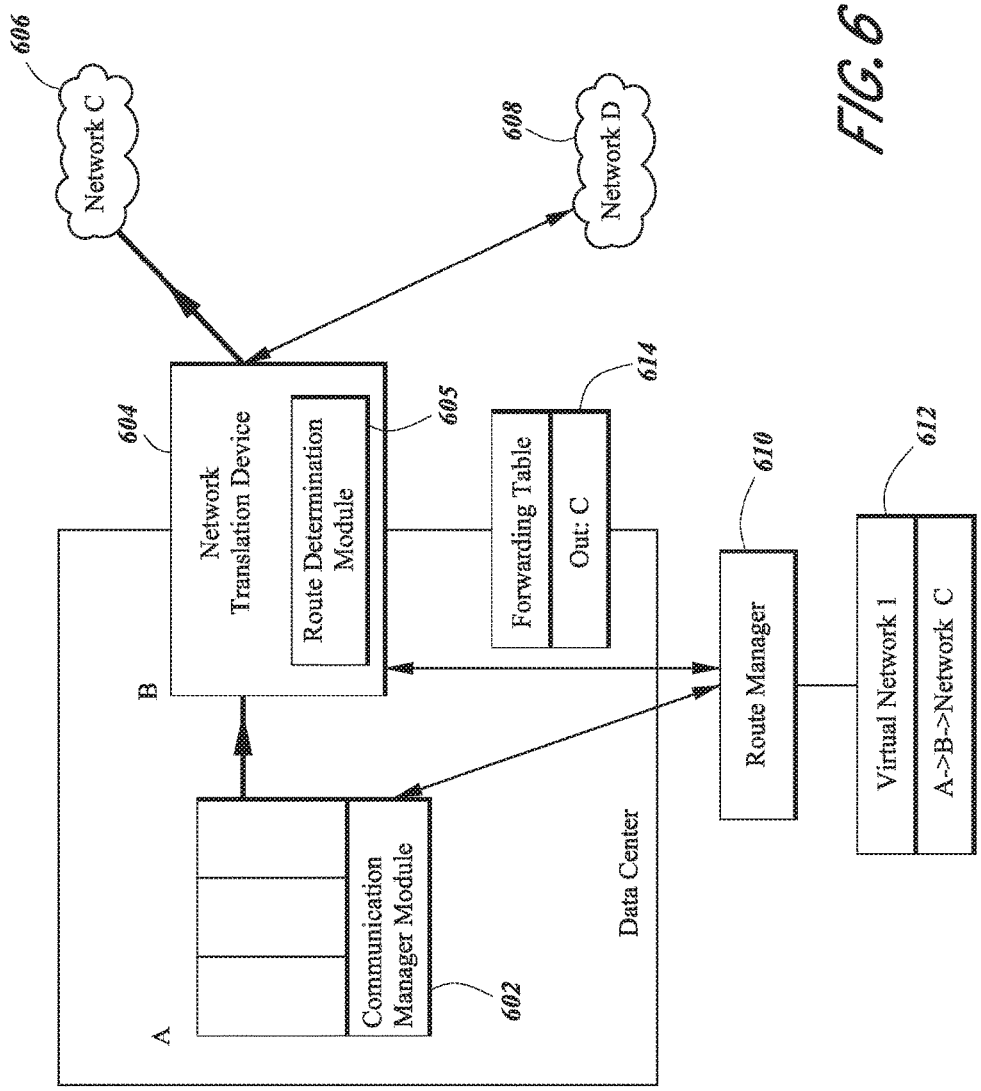
FIG. 6 is a block diagram of the substrate network of FIG. 1 illustrating the determination of routes into or out of a virtual network by network translation device.

FIG. 6 illustrates an example substrate network wherein a network translation device determines routes into or out of a virtual network. In FIG. 6, a communication, such as a data packet, leaves computing node A, which is associated with a virtual network, through NTD B 604. The network translation device can include a Route Determination module 605 for determining the packet route. NTD B is connected to network C 606 and network D 608.

In FIG. 6, the Route Manager 610 receives a network configuration or determines that route A-B-C is preferred or has a cheaper cost. The Route Manager can store the route in a routing table 612. The Route Manager can then send forwarding entries to the NTD B 604 that configure it to send traffic through network C 606. NTD B can contain multiple forwarding entries for multiple virtual networks, such that data for one virtual network can be sent through network C, while another virtual network sends data through network D. In some cases, network packets with the same source and/or destination are sent by different networks based on the associated virtual network.

In some embodiments, the substrate component may not have a Communication Manager or a Route Determination module and other ways of coordinating routing can be used. For example, a substrate component, such as an ordinary router or a network translation device, can be set up multiply on separate paths. Using blacklists, network traffic for a particular virtual network can be allowed on one path but blocked on others. The Route Manager can send a control signal or message updating the blacklists to manage the data flow.

In other embodiments, substrate components can implement IP aliasing, where, for example, "fast" path packets use one set of IP addresses, while "slow" path packets use another set of IP addresses. When the substrate component receives the packet, it can determine which path to use based on the IP address. The Route Manager can send a control signal or message to assign IP addresses to the components based on the type of traffic handled.

Other ways of differentiating how packets are handled by substrate components include: tagging of packets, such as by Multiprotocol Label Switching (MPLS); MAC stacking where a packet could have multiple MAC addresses, the first MAC address for a substrate component, such as a switch, and a second MAC address for a next component either on the "fast" or the "slow" path; and using Network Address Translation (NAT) devices on both ends of a network in order to redirect traffic into the network, such as by spoofing or altering an destination address for an incoming packing and/or altering an the source address of an outgoing packet. In some embodiments, the Route Manager generates control signals or messages for coordinating traffic on the substrate network for the various techniques described above.

Virtual Network Route Selection Process

Figure 7A:
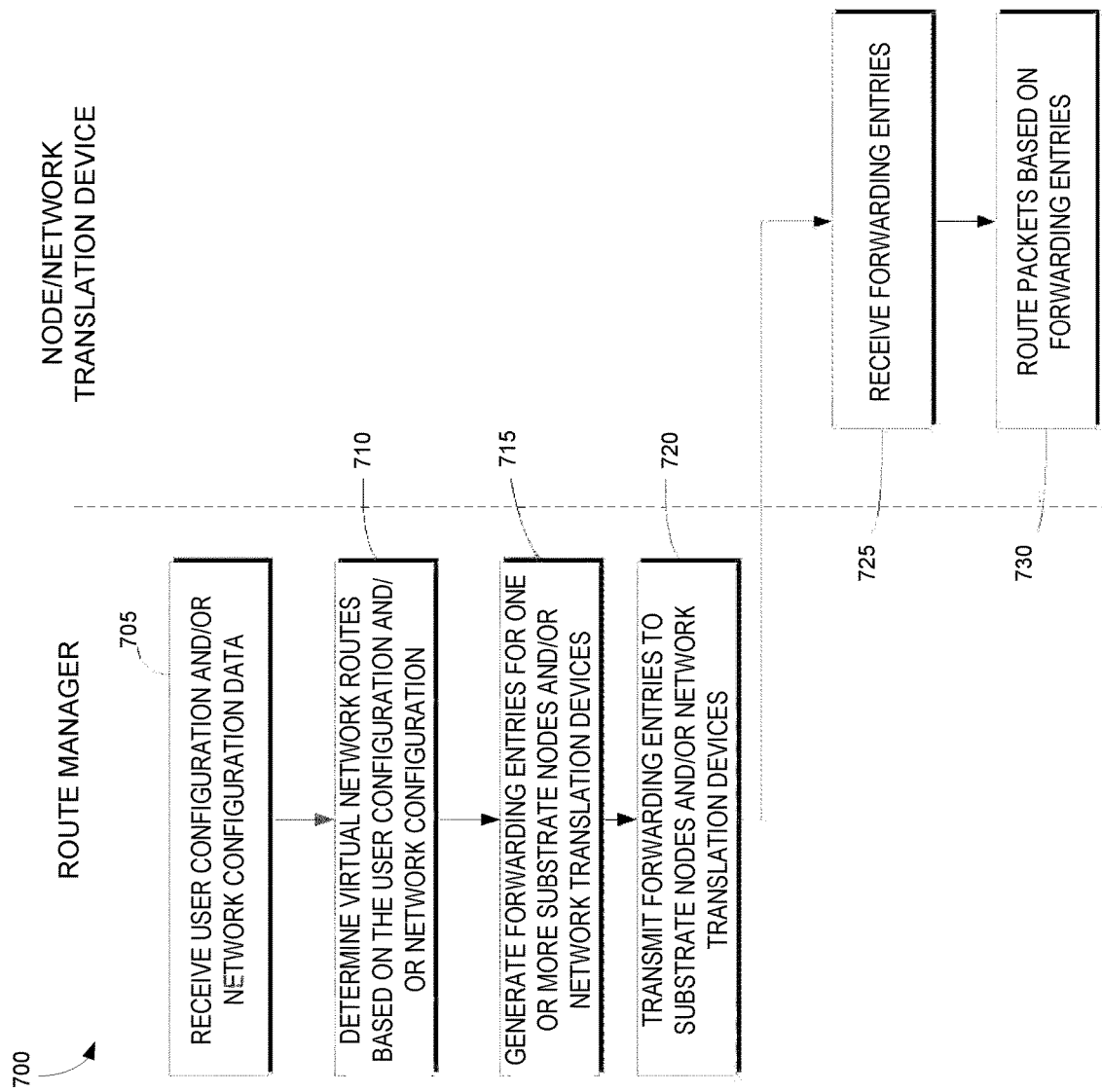
FIG. 7A illustrates a flow diagram for a process of propagating virtual routes to a substrate network.

FIG. 7A illustrates a flow diagram for a process 700 of propagating virtual routes to a substrate network usable in the example networks described above. The virtual routes can be based on network configuration data provided by a virtual network user, such as costs, component characteristics, preferred routes, and/or the like.

At block 705, the Route Manager module receives user configuration and/or network configuration data, such as, for example, policy based routing decisions made by the user. In some embodiments, a user interface is provided, allowing a user to specify configuration data. The Route Manager can receive the configuration data from a data store, for example, if user configuration and/or network configuration data are stored on the data store after being received on the user interface or otherwise generated. In some embodiments, the configuration data can include explicit routing paths through the virtual network. In some embodiments, the configuration data can specify associated costs for traversing components of the virtual network, such as links and/or nodes. These costs can be based on monetary costs, packet loss rates, reliability rate, and/or other metrics. These costs can be provided by the user to configure the virtual network provided by the data center operator. However, costs and other network configuration data can come from the data center operator themselves in addition to or instead of from the user. For example, the data center operator can use the virtual network to provide feedback to the user on routing costs, such as by associating monetary use costs for the substrate computing nodes and/or components. In one example, the data center operator can specify a high cost for a high speed network link or high powered computing node so that the virtual network user can take into account that cost in configuring the virtual network.

At block 710, the Route Manager module determines virtual network routes based on the user configuration and/or network configuration data. In some embodiments, routing protocols or the route determination algorithms of the routing protocols, such as BGP, OSPF, RIP, EIGRP, or the like, can be used to determine virtual routes.

At block 715, the Route Manager determines one or more forwarding entries for substrate network components, such as computing nodes, network translation devices, or the like. As the Route Manager can determine routing paths and propagate routing decisions to the substrate components, the Route Manager can coordinate routing within a data center and/or between multiple data centers.

At block 720, the Route Manager transmits the forwarding entries to the substrate components. At block 725, the substrate component receives the forwarding entries. The substrate network components can store the forwarding entries in FIB tables or similar structures. Generally, a Communication Manager on the substrate component receives and processes the forwarding entry and manages communications of the substrate component.

However, as discussed above, network traffic can also be coordinated for substrate components without a Communication Manager using instead, for example, a NAT device or the like. In some embodiments, the Route Manager can send blacklist updates, manage tagging of the packets, generate stacked MAC addresses, or the like.

At block 730, the substrate components route packets received or generated according to the stored forwarding entries. Generally, a Communication Manager on the substrate component manages the packet routing and refers to the forwarding entries to make forwarding decisions.

Substrate Network Route Selection Process

Figure 7B:
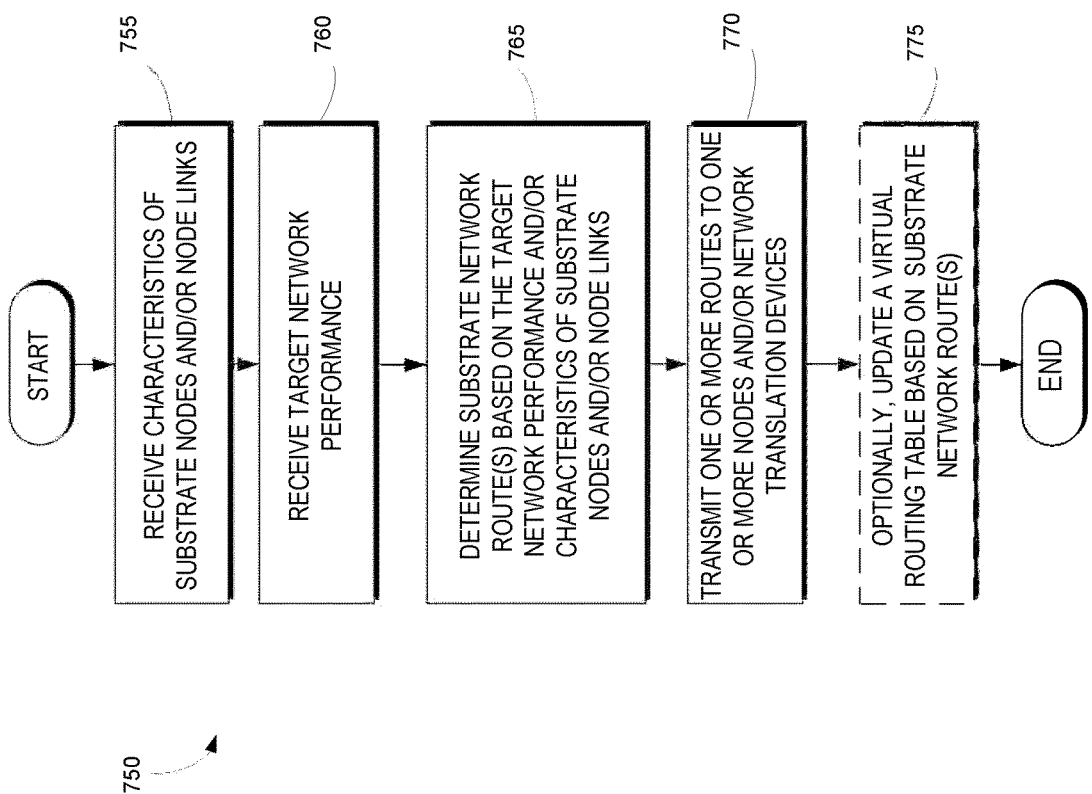
FIG. 7B illustrates a flow-diagram for a process of determining substrate routing based on target performance characteristics of the associated virtual network.

FIG. 7B illustrates a flow-diagram for a process 750 for determining substrate routing based on target performance characteristics of the associated virtual network usable in the example networks described above. In some instances, the Route Manager can optionally generate a virtual routing table for the virtual network before determining substrate routing. The virtual routing table can be used to determine virtual routing paths, allowing optimization of network traffic by selective association of the virtual network components with substrate computing nodes, such as by taking into account physical location and virtual network traffic patterns. However, generation of the virtual routing table is not necessary as the substrate routes can be determined independently of the virtual routes, as will be described below. In addition, user configuration and/or network configuration data provided by the user can be used to describe the virtual network, without needing to generate a virtual routing table.

At block 755, the Route Manager receives characteristics of the substrate nodes and/or node links. The Route Manager can receive the characteristics data from a data store. In some embodiments, a user interface is provided, allowing a user to specify characteristics data. The characteristics can describe such things as monetary costs, network bandwidth, network security, network latency, network reliability, and/or the like. These characteristics can be used in a cost function for determining substrate routing paths. This information can be kept by the Route Manager or data source accessible by the Route Manager.

At block 760, the Route Manager receives a target network performance for the virtual network. The target performance can be based on a purchased service level by the user, user history, security data, or the like. For example, a service level purchased by a user can have minimum bandwidth, latency, or quality of service requirements. In another example, a user can be a new customer with an unknown payment history such that the user is provisioned on a "slow" virtual network in order to minimize incurred expenses in case the user fails to pay. In another example, a user identified as carrying dangerous or prohibited traffic, such as viruses, spam, or the like, can be quarantined to particular substrate components. During quarantine, the virtual network components can be assigned to specialized substrate components with more robust security features. For example, the substrate components can have additional monitoring functionally, such as a deep-packet scanning ability, or have limited connectivity from the rest of the substrate network.

At block 765, the Route Manager determines substrate network routes based on the target network performance and/or characteristics of the substrate nodes and/or links. In one embodiment, the Route Manager can use the characteristic data in a cost function for determining routes. Which characteristic to use or what level of service to provide can be determined by the performance criteria or target performance. For example, for a "fast" route, the Route Manager can use bandwidth and/or latency data for the substrate network to generate routes that minimize latency, maximize available bandwidth, and/or otherwise improve network performance.

The Route Manager can re-determine routes as needed based on changes in the network, the configuration data, and/or the performance level. For example, if a user has purchased N gigabits of "fast" routing but has reached the limit, the Route Manager can generate new routes and shift the user to "slow" routing.

At block 770, the Route Manager transmits forwarding entries for one or more routes to one or more nodes and/or network translation devices. In some embodiments, the Route Manager determines forwarding entries for the substrate components and sends those forwarding entries to the substrate components on the path. In some embodiments, the Route Manager can send blacklist updates, manage tagging of data packets, and/or generate stacked MAC addresses.

At block 775, the Route Manager can optionally update the virtual routing table based on substrate network routes. By changing the virtual network routing table based on the substrate routes, the virtual network can stay logically consistent with the behavior of the substrate network. Thus, users will not necessarily be confused by discrepancies in the virtual routing.

Interaction with a Virtual Network

Figure 8:
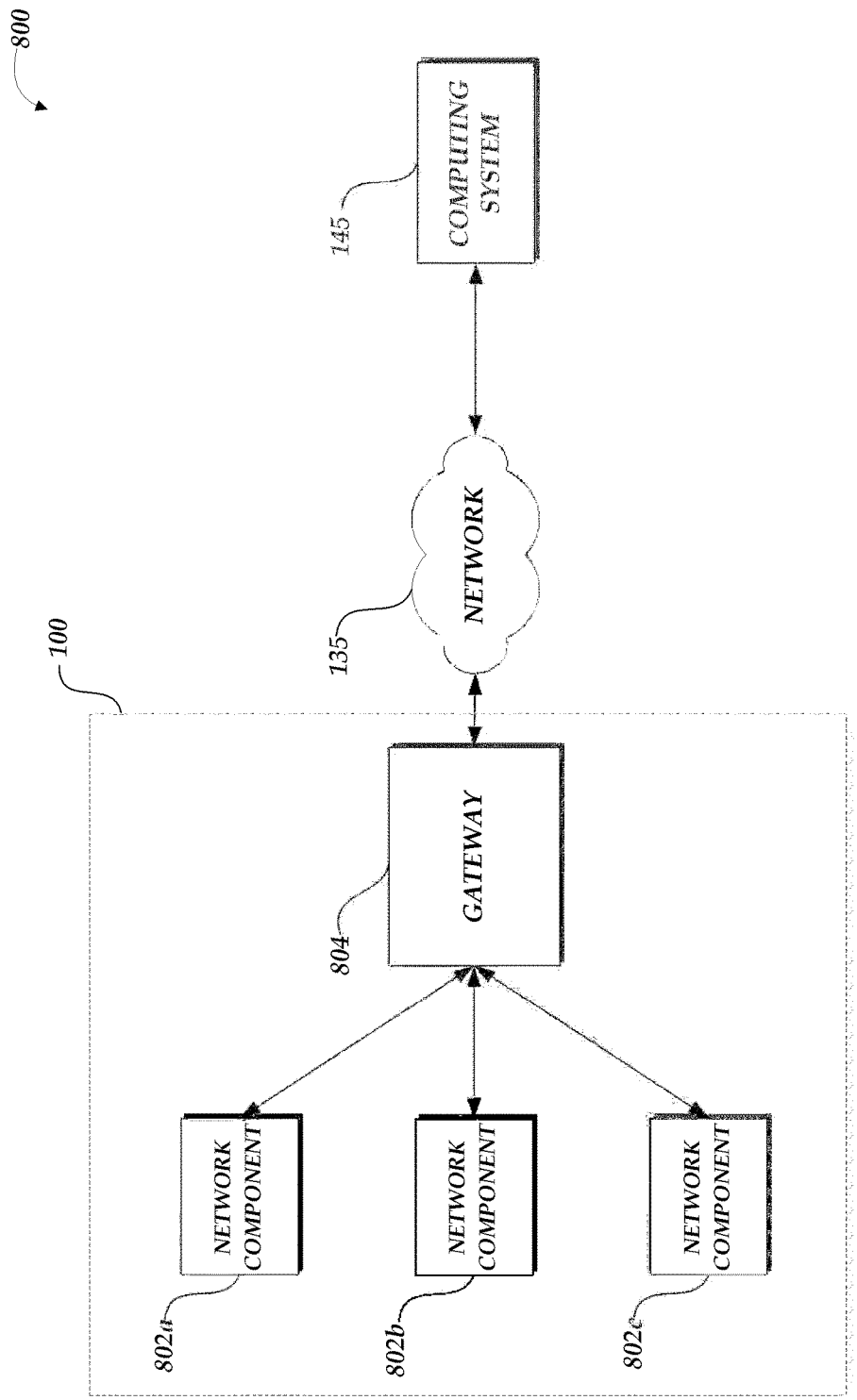
FIG. 8 illustrates a virtual network as simulated by the substrate network of FIG. 1.
Figure 9:
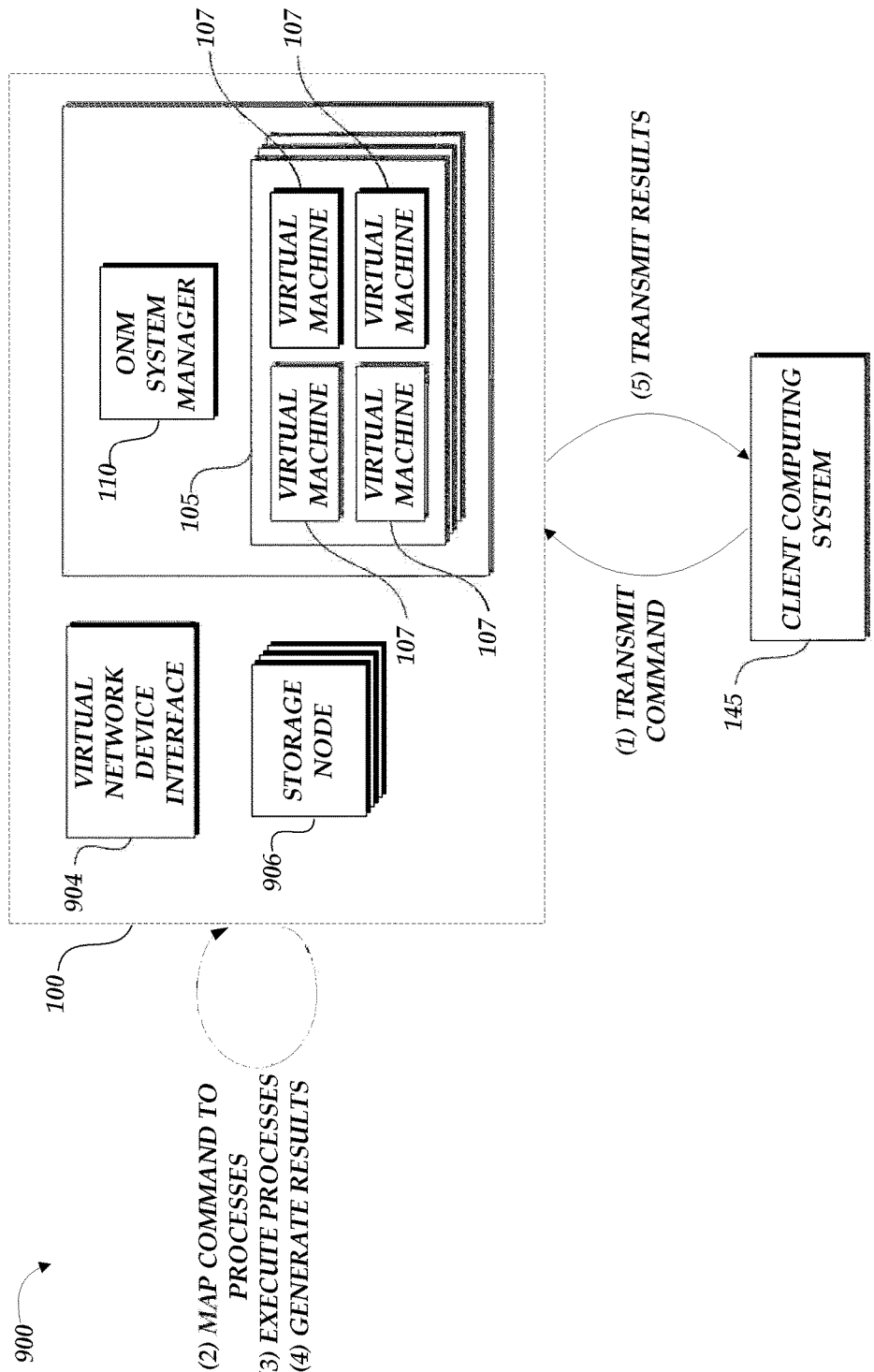
FIG. 9 is a simplified block diagram of the substrate network of FIG. 1 illustrating the processing of commands generated by a client computing device.
Figure 10:
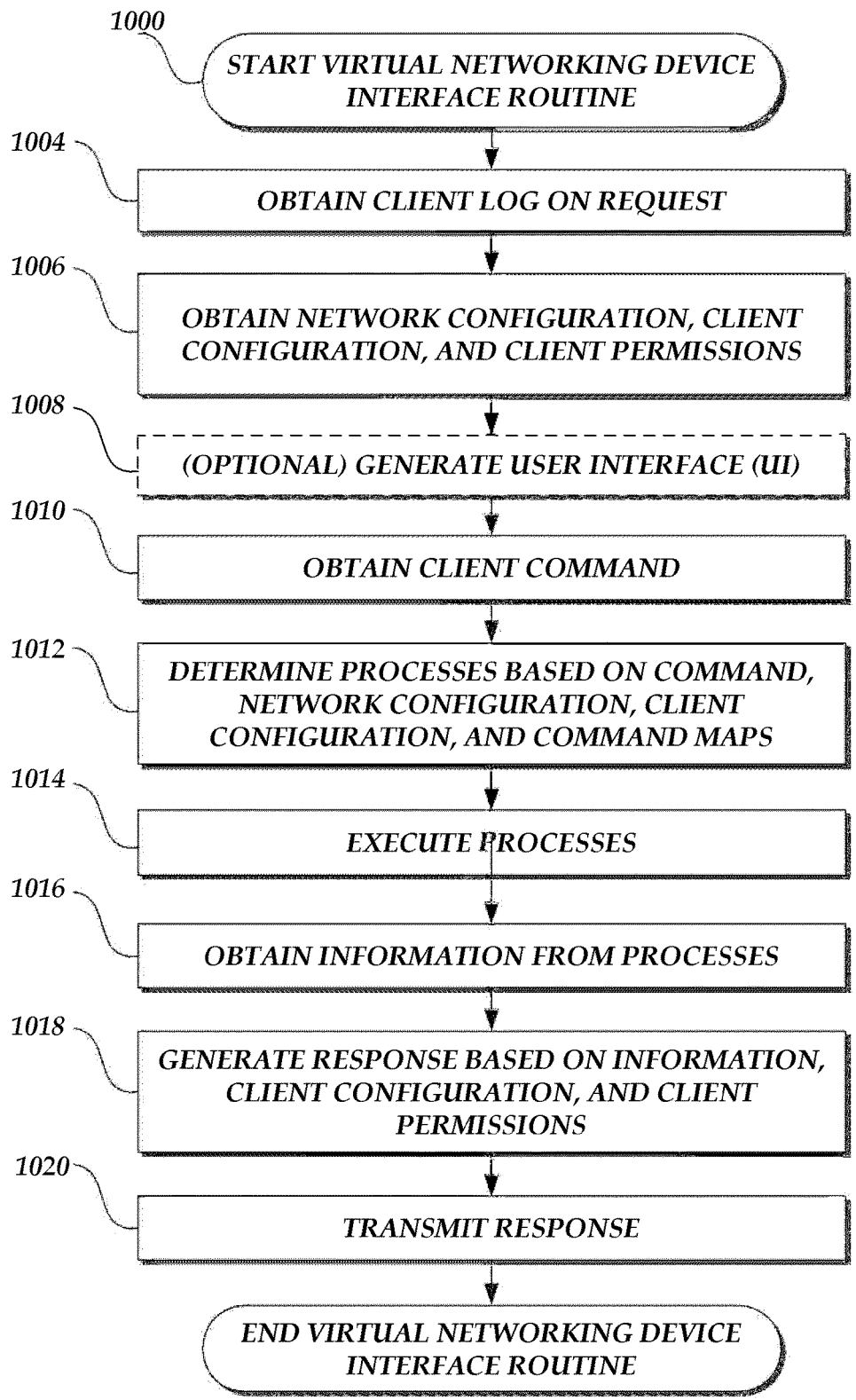
FIG. 10 illustrates a flow-diagram for a process of simulating a network component for facilitating a client computing device interaction.

With reference now to FIGS. 8-10, various embodiments for interaction with a virtual network will be described. With reference to FIG. 8, a system 800 for interaction with a virtual network topology simulated within the substrate network 100 of FIG. 1 is illustrated. The virtual network topology includes any number of logical network components 802 in connection with a logical gateway 804. The logical components 802 can correspond to one or more physical computing devices typically associated with a physical network, such as network devices, server devices, storage devices, and the like. As described previously, both the logical gateway 804 and the logical network components 802 may be simulated by physical components of the substrate network 100. In a manner similar to as described above with reference to FIG. 1, the substrate network 100 is connected to an external communications network 135 which is, in turn, connected to a client computing system 145. Though, for illustrative purposes, a single client computing system 145 is shown, one of ordinary skill in the art will appreciate that any number of client computing systems 145 may interact with the substrate network 100.

The logical gateway 804 may obtain commands from a client computing system 145 via the external communications network 135. Illustratively, a client computing device 145 may transmit commands typically associated with the management of a physical computing network. In one aspect, the client computing device commands might correspond to passive reporting commands that return information regarding the routing of data or the status of network components 802. Examples include, but are not limited to, commands for statistical information regarding the flow of data between network components 802, commands for information corresponding to the current or past status of the logical gateway 804, or commands for retrieval of data transmitted by the logical gateway 804. In another aspect, the client computing device requests can correspond to active commands that modify functional aspects of the logical gateway 804. Examples include, but are not limited to, commands to alter interfaces of the logical gateway 804, commands to shape data flowing through logical gateway 804, or commands to alter user configurations stored on the logical gateway 804. Additionally, though system 800 depicts a logical gateway 804, one of ordinary skill in the art will appreciate that substrate network 100 may simulate any number of networking devices, including routers, multilayer switches, and any networking device capable of interaction with a client computing device 804. Additionally, the substrate network 100 may simulate the functionality of networking equipment, such as routers, without simulating the network device.

As will be described in more detail below, once a command is received at the logical gateway 804, a set of processes are determined which are executed by physical components of the substrate network. As will be discussed in more detail below, the set of processes are determined by mapping the received command to the set of processes, such that the user obtains an expected result from the network simulated by the substrate network 100. For example, a user may issue a command requesting traffic data for all traffic from network component 802a through gateway 804. In the substrate network 100, logical gateway 804 may be simulated by a number of physical components. For example, traffic from network components 802 may flow through substrate physical networks 310 and 312 of FIG. 3.

In some embodiments, as is described above, traffic which is simulated to originate from network components 802 may have flow through different networks or network components at different time periods, as is determined by the substrate network 100. As such, the requested traffic data may not exist completely within any individual component of the substrate network 100. The logical gateway 804 functions, in part, to determine which components of the substrate network 100 contain the user requested data. One this determination is made, the data may be collected from the various physical components, and the information may be returned to the client computing system 145.

With reference now to FIG. 9, a simplified block diagram of the substrate network 100 of FIG. 1 will be described for purposes of illustrating the interaction between various components of the substrate network. However, one skilled in the relevant art will appreciate that illustrative interaction and communications may include, or otherwise involve, additional components not illustrated in the illustrative drawing figures.

The substrate network 100 includes a number of physical computing systems 105 that host one or more virtual machine instances 107. As will be explained in greater detail, the number of virtual machine instances hosted on each physical computing system 105 can vary according to the computing device resources associated with each individual physical computing system 105 and in accordance with the management policies of the substrate network 100. The substrate network 100 also includes a virtual machine manager component, such as ONM system manager 110, for managing the allocation of virtual machine instances 107 on the various physical computing systems 105. Although the virtual machine manager component is illustrated with regard to functionality implemented by a component of the substrate network 100, in an alternative embodiment, the virtual machine manager component may be implemented as a stand alone component of the substrate network, integrated into a single physical computing system 105 or distributed as functionality implemented among multiple physical computing devices 105.

In communication with the ONM system manager 110 is an interface module 904 for obtaining requests from various client computing systems 145 via an external communication network, such as external communications network 135 of FIG. 1. The interface module 904 can obtain various commands from the client computing system 145. For example, the interface module 904 may simulate the client interface to logical gateway 804 of FIG. 8. The interface module 904 can then facilitate interaction with the substrate network 100 and the physical computing devices 105. Illustratively, the interface module 904 may obtain commands from the client computing systems 145 via multiple interface methods, such as simple network management protocol (SNMP) or command line interface (CLI). Although the interface module 904 is illustrated with regard to functionality implemented by a component of the substrate network 100, in an alternative embodiment, the interface module 904 may be implemented as a stand alone component of the substrate network, integrated into a single physical computing system 105, or distributed as functionality implemented among multiple physical computing devices 105.

In addition, though a single interface module 904 is illustrated, some aspects of the present disclosure include multiple interface modules 904. Such interface modules may communicate in order to implement desired functionality. In some embodiments, an interface module 904 may be configured to operate under a specific interface or protocol. For example, a first interface module 904 may function to receive commands via a CLI, while a second interface module may receive commands via SNMP. As will be appreciated by one of ordinary skill in the art, multiple interface modules 904 may be implemented in a variety of manners.

Also in communication with the interface module 904 is one or more storage nodes 906 for archiving or storing information associated with the mapping of client commands into processes. The storage nodes 906 can correspond to various storage media including physical storage media associated specifically with the substrate network 100. Additionally, or alternatively, the storage nodes 906 can correspond to various network based storage networks accessible to the substrate network 110 via a communication network.

As shown in FIG. 9, the client computing system 145 transmits a command to substrate network 100. Illustratively, the client may transmit a command requesting that logical gateway 804 of FIG. 8 redirect all incoming data directed towards network component 802a of FIG. 8 to network component 802b of FIG. 8. This request would then be received by interface module 904. Secondly, the interface module 904 maps the received command to a set of processes using information stored within the storage node 906. For example, the storage node 906 may contain information regarding the virtual machine or machines 107 that function in the simulation of network components 802a and 802b. Illustratively, the simulation of some functions, such as routing functions, may not actually be simulated until a command has been received corresponding to the requested routing function. In this example, the interface module may determine that new routing information must be sent to one or more virtual machines 107 or their corresponding ONM system managers 110. Third, the interface module causes the execution of the determined processes on the required components of substrate network 100. Illustratively, this may include sending calls to the substrate network 100 via established Application Protocol Interfaces ("APIs") provided by the substrate network 100. Fourth, the interface module generates a set of results based on the executed processes. In the current example, this may include responses from an ONM system manager 110 or virtual machines 107 that the new routing information has been received and processed. In the fifth step, the interface module 904 transmits the generated results to the client computing system 145.

With reference now to FIG. 10, a flow diagram illustrative of a virtual networking device interface routine 1000 executed by an interface module, such as interface module 904, will be described. Illustratively, routine 1000 can be implemented upon determination that a client computing device 145 wishes to interact with a simulated network device, such as logical gateway 804. At block 1004, the interface module 104 obtains a command from a client computing device 145 to log on to the simulated gateway 804. In some embodiments, this request may be obtained through various protocols, such as via secure shell (SSH). In some embodiments, the simulated network component with which the client computing device 145 wishes to interact may be determined based on the network address, such as an IP address, on which a request is received. In other embodiments, a simulated network component may be identified based on the log on credentials supplied by the client computing device 145.

Once a log on request is received, the interface module 904 may, in some embodiments, determine whether the user is authorized to log on. In some embodiments, this determination may not occur until configurations are obtained at block 1006. In other embodiments, information pertaining to log on requests may be stored separately from client configuration, such as in a storage node 906. If, based on the information pertaining to the log on requests, the interface module determines that the log on request is unauthorized, the interface module may end the networking device interface routine. In these embodiments, if a log on request is determined to be authorized, the routine continues at block 1006.

At block 1006, the network configuration, client configuration, and client permissions are obtained by the interface module 904. These obtained items allow the function of the interface module 904 to be altered according to the desires of the user or the administrator of the substrate network 100. For example, the client configuration may include information pertaining to the client's interaction with the interface module 904, such as a preferred style of user interface. Additionally, the client configuration may contain customized commands which facilitate specialized interaction with the substrate network 100. In some embodiments, the client configuration may include other client data, such as provided contact information of the client. Client permissions may specify which commands or results a client is authorized to access. In some embodiments, client permissions may specify multiple clients which may access various aspects of the interface module 904 according to the permissions accorded to each client. Such client permissions might be specified by the operator of the substrate network, or designated users of the virtual network. The network configuration may contain information regarding the simulated network, the substrate network 100, or both. The interface module 904 may use this information, for instance, to determine which functions a client computing device 145 may invoke, or to determine which network devices 802 to allow interaction with. These configurations may be stored in a storage node, such as storage nodes 906. In some embodiments, a client computing device 145 may transmit a client configuration or client permissions to the interface module 904 within the obtained request.

Optionally, at block 1008, a user interface may be caused to be presented on the client computing device 145. The style of the user interface may be determined based on the client configuration obtained at block 1006. For example, a client may prefer to interact with the interface module 904 via a command line interface. The style of interface can be further simulated, such that the interface provided to a user is similar to the interface provided by a specific type of networking device, or similar to a particular network operating system. In some embodiments, a user interface may not be desired or even required, such as where the client is already provided with a user interface via an application on the client computing device 145.

At block 1010, a command is received from the client computing device 145. As discussed above, the user may transmit a command requesting that logical gateway 804 redirect all incoming data directed towards network component 802a to network component 802b, or that statistical data regarding traffic on logical gateway 804 be returned to the user. In some embodiments, the client command may correspond to a request that a simulated component configure a new interface or protocol. As previously discussed, this command may relate to any command which may be received on the networking device which is simulated.

At block 1012, a set of processes are determined based on the command and the various configurations. As discussed above, these processes may be determined based on mapping information stored within a storage node, such as storage node 906. For example, the storage node 906 may contain information regarding to the virtual machines 107 or ONM system manager 110 which simulate network components 802a and 802b. The storage node 906 may further contain information allowing user commands to be mapped into specific processes. For example, a user command to "show IP routes" may, based on information within the storage node, be mapped to the command which would return a routing table of a virtual machine 107 or a ONM system manager 110. Such mapping information may be specific to a virtual machine 107 or ONM system manager 110, such that "show ip routes" may result in an Application Protocol Interface (API) calls when implemented by some components, or SNMP commands when implemented by other components. Though API calls and SNMP commands are used for illustrative purposes, the determined set of processes may correspond to any command which may be implemented by a network component. In addition, mapping may be associated with the make or model of a particular component, such that each determined process will carry out the desired function on a particular component. For example, the determined set of processes may depend on the manufacturer or operating system of the components toward which each process is directed.

Therefore, at block 1012, a set of processes would be determined such that the routing of incoming data to network component 802a is redirect to network component 802b. This may involve modifications to virtual machines 107 associated with networking components 802a and 802b. Additionally, this may involve modifications to one or more ONM system managers 110.

The set of processes may also be determined according to the obtained client configuration, network configuration, and client permissions. For example, a received command may correspond to a customized command specified within the client configuration. In some embodiments, client permissions may be used to determine whether the user, as determined by the log on request, is authorized to execute the obtained command. If the interface module 904 determines that the user is unauthorized, the routine 1000 may be ended. In some embodiments, the user may be notified that they are unauthorized to execute such a command. Further, unauthorized access attempts may be stored in a data log for review by authorized users or administrators. In this embodiment, if the interface module 904 determines that the user is authorized to execute the command, the routine proceeds to block 1014.

At block 1014, the interface module 904 causes the identified set of processes to be executed on components of the substrate network 100. For example, where the command specifies that all incoming network traffic directed towards networking component 802a be redirected to 802b, a process may be executed on the ONM system managers 110 which correspond to networking components 802a and 802b. As described above, this may include sending calls to the substrate network 100 via established APIs provided by the substrate network 100. In some embodiments, execution of the set of processes may be caused by other interface methods, such as SNMP.

At block 1016, the interface module 904 obtains information corresponding to the executed processes. For example, a command rerouting traffic from logical network component 802a to 802b may result in a notification that the processes executed successfully. Where other processes are executed, such as requests for traffic statistics, the information obtained may correspond to network information from various ONM system managers 110 or other components of the substrate network 100.

At block 1018, a response is generated based on the received information corresponding to the executed processes. In some embodiments, this may include simply relaying the information obtained at block 1016. For instance, where a command corresponds to a routing request, both the information received at block 1016 and the generated response may indicate that the routing request executed successfully. In some embodiments, the generated requests may differ substantially from the information obtained at block 1016. For example, where a command corresponds to a request for network traffic, the information obtained at block 1016 may reflect traffic information of the substrate network 100. Because the user may not have knowledge of the topology of the substrate network 100, this information may be reformatted in accordance with the configuration of the simulated virtual network, as may be provided by the obtained network configuration. This may entail combining or compiling the information such that it corresponds to an expected response from a simulated logical component, such as logical gateway 804. Additionally, a response may be modified by the client configuration or the client permissions. For example, a style of response for some or all commands may be specified in the client configuration. In some embodiments, client permissions may specify that some information may not be divulged to a user. In these embodiments, the generated results would omit prohibited information.

At block 1020, the generated response is transmitted to the user. Though this flow diagram is illustrative of a single command and response, one of ordinary skill in the art will appreciate that the routine, or portions of the routine, may be repeated for multiple commands. For example, at block 1020, the routine may return to block 1010 in order to receive additional client commands. In some embodiments, the routine may incorporate security features, such that if a command is not received in a specified period of time, the routine may return to block 1004, require a user to provide additional log on criteria.

It will be appreciated by those skilled in the art and others that all of the functions described in this disclosure may be embodied in software executed by one or more processors of the disclosed components and mobile communication devices. The software may be persistently stored in any type of non-volatile storage.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art. It will further be appreciated that the data and/or components described above may be stored on a computer-readable medium and loaded into memory of the computing device using a drive mechanism associated with a computer readable storing the computer executable components such as a CD-ROM, DVD-ROM, or network interface further, the component and/or data can be included in a single device or distributed in any manner. Accordingly, general purpose computing devices may be configured to implement the processes, algorithms, and methodology of the present disclosure with the processing and/or execution of the various data and/or components described above.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A computer-implemented method comprising:
   obtaining, via an emulated interface associated with a target component of a virtual network, a client command directed towards the target component, wherein the target component corresponds to a representation of a hardware networking device, wherein the virtual network is overlaid on a substrate network executing one or more computer systems, and wherein at least a portion of functionality attributable to the target component is implemented by the one or more computer systems of the substrate network;
   causing execution of a set of substrate commands on the one or more computer systems of the substrate network to implement the portion of functionality attributable to the target component in accordance with the client command;
   obtaining, from the one or more computer systems of the substrate network, a set of results responsive to the execution of the set of substrate commands, wherein the set of results responsive to the execution of the set of substrate commands are obtained from the one or more computer systems of the substrate network in lieu of instantiating the target component to execute the client command; and generating, based at least partly on the set of results, a client result attributable to a response to the client command by the target component.

2. The computer-implemented method of claim 1, wherein network traffic routing within the substrate network is independent from network traffic routing within the virtual network.

3. The computer-implemented method of claim 1, wherein the emulated interface corresponds to a simple network management protocol (SNMP) interface or command line interface (CLI).

4. The computer-implemented method of claim 1 further comprising:
identifying the one or more computer systems of the substrate network; and
mapping the client command into the set of substrate commands in accordance with the identification of the one or more computer systems.

5. The computer-implemented method of claim 1, wherein generating the client result comprises formatting the set of results in accordance with an expected output of the logical target component.

6. The computer-implemented method of claim 1, wherein generating the client result comprises withholding a portion of information included in the set of results.

7. The computer-implemented method of claim 1 further comprising causing transmission of the client result to a client computing device where the client command originated.

8. The computer-implemented method of claim 1, wherein the emulated interface comprises one or more of an application programming interface, a user interface, or a command line interface.

9. A non-transitory computer readable storage medium storing computer executable instructions that when executed by a processor perform operations comprising:
obtaining, via an emulated interface associated with a target component of a virtual network, a client command directed towards the target component, wherein the target component corresponds to a representation of a hardware networking device, wherein the virtual network is overlaid on a substrate network, and wherein at least a portion of functionality attributable to implementation of commands by the target component is implemented by one or more physical devices of the substrate network;
obtaining, from the one or more physical devices of the substrate network, a set of results responsive to an execution of a set of substrate commands on the one or more physical devices of the substrate network to implement the portion of functionality associated with an implementation of the received client command without executing the client command, wherein the client command and the set of substrate commands are different, wherein the results responsive to the execution of the set of substrate commands are obtained from the one or more physical devices of the substrate network in lieu of instantiating the target component to execute the client command; and
generating, based at least partly on the set of results, a client result attributable to a response to the client command by the target component.

10. The non-transitory computer readable storage medium of claim 9, wherein the target component is associated with both a hardware identifier and a virtual network identifier for network traffic routing on the virtual network.

11. The non-transitory computer readable storage medium of claim 9, wherein the operations further comprise obtaining a network configuration, wherein the network configuration corresponds to at least one of the virtual network or the substrate network.

12. The non-transitory computer readable storage medium claim 11, wherein the network configuration indicates functions that can be invoked on the target component.

13. The non-transitory computer readable storage medium claim 11, wherein causing execution of the set of substrate commands further comprises sending application protocol interface (API) commands to the one or more physical devices of the substrate network.

14. The non-transitory computer readable storage medium of claim 9, wherein the operations further comprise obtaining a client configuration, wherein the client configuration facilitates interactions between a client computing system and the target component.

15. The non-transitory computer readable storage medium of claim 14, wherein creating the client result includes modifying the set of results based, at least in part, on the client configuration.

16. The non-transitory computer readable storage medium of claim 9, wherein the emulated interface comprises one or more of an application programming interface, a user interface, or a command line interface.

17. A system comprising:
at least one data store configured to at least store computer-executable instructions; and
at least one processor in communication with the data store, the processor configured to execute the computer-executable instructions to at least:
obtain, via an emulated interface associated with a target component of a virtual network, a client command towards the target component, wherein the target component corresponds to a representation of a hardware device, wherein the virtual network is overlaid on a substrate network, and wherein at least a portion of functionality attributable to the target component is implemented by one or more physical components of the substrate network; and
generate a client result attributable to a response to the client command, the client result corresponding to an outcome of an execution of a set of substrate commands on the one or more physical components of the substrate network to implement the portion of functionality attributable to the target component in accordance with the client command, wherein the outcome of the execution of the set of substrate commands are generated on the one or more physical components of the substrate network in lieu of instantiating the target component to execute the client command.

18. The system of claim 17, wherein the at least one processor is further configured to obtain configuration information related to at least one of the virtual network, the substrate network, a client computing system, or a user utilizing the client computing system.

19. The system of claim 18, wherein the at least one processor is further configured to determine the set of substrate commands based, at least in part, on the configuration information.

20. The system of claim 18, wherein the at least one processor is further configured to generate the client result based, at least in part, on the configuration information.

21. The system of claim 17, wherein the emulated interface comprises one or more of an application programming interface, a user interface, or a command line interface.

* * * * *